(12) United States Patent
Hossain et al.

(10) Patent No.: US 11,081,554 B2
(45) Date of Patent: Aug. 3, 2021

(54) INSULATED GATE SEMICONDUCTOR DEVICE HAVING TRENCH TERMINATION STRUCTURE AND METHOD

(71) Applicant: SEMICONDUCTOR COMPONENTS INDUSTRIES, LLC, Phoenix, AZ (US)

(72) Inventors: Zia Hossain, Tempe, AZ (US); Tetsuro Asano, Oizumi-machi (JP); Syoji Miyahara, Kumagaya (JP); Yasuyuki Sayama, Aizuwakamatsu (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 129 days.

(21) Appl. No.: 16/134,598

(22) Filed: Sep. 18, 2018

(65) Prior Publication Data
US 2019/0115436 A1 Apr. 18, 2019

Related U.S. Application Data

(60) Provisional application No. 62/571,428, filed on Oct. 12, 2017.

(51) Int. Cl.
*H01L 29/423* (2006.01)
*H01L 29/06* (2006.01)
(Continued)

(52) U.S. Cl.
CPC ........ *H01L 29/407* (2013.01); *H01L 29/0615* (2013.01); *H01L 29/0619* (2013.01);
(Continued)

(58) Field of Classification Search
CPC ... H01L 29/0634; H01L 29/0865–0869; H01L 29/1095; H01L 29/41766;
(Continued)

(56) References Cited

U.S. PATENT DOCUMENTS 5,592,005 A * 1/1997 Floyd .................. H01L 29/7827
257/331
6,396,090 B1 5/2002 Hsu et al.
(Continued)

FOREIGN PATENT DOCUMENTS

WO 2013103491 A1 7/2013

*Primary Examiner* — Maliheh Malek
(74) *Attorney, Agent, or Firm* — Kevin B. Jackson

(57) ABSTRACT

A semiconductor device structure includes a region of semiconductor material comprising a first conductivity type, an active region, and a termination region. A first active trench structure is disposed in the active region, and a second active trench structure is disposed in the active region and laterally separated from the first active trench by an active mesa region having a first width. A first termination trench structure is disposed in the termination region and separated from the second active trench by a transition mesa region having a second width and a higher carrier charge than that of the active mesa region. In one example, the second width is greater than the first width to provide the higher carrier charge. In another example, the dopant concentration in the transition mesa region is higher than that in the active mesa region to provide the higher carrier charge. The semiconductor device structure exhibits improved device ruggedness including, for example, improve unclamped inductive switching (UIS) performance.

17 Claims, 17 Drawing Sheets

(51) Int. Cl.
  *H01L 29/08*    (2006.01)
  *H01L 29/66*    (2006.01)
  *H01L 29/78*    (2006.01)
  *H01L 29/739*   (2006.01)
  *H01L 29/872*   (2006.01)
  *H01L 29/40*    (2006.01)
  *H01L 29/36*    (2006.01)
  *H01L 29/10*    (2006.01)
  *H01L 29/812*   (2006.01)
  H01L 21/3065    (2006.01)
  H01L 29/417    (2006.01)

(52) U.S. Cl.
  CPC ...... *H01L 29/0657* (2013.01); *H01L 29/0696* (2013.01); *H01L 29/0865* (2013.01); *H01L 29/1004* (2013.01); *H01L 29/36* (2013.01); *H01L 29/404* (2013.01); *H01L 29/4236* (2013.01); *H01L 29/66348* (2013.01); *H01L 29/66734* (2013.01); *H01L 29/66848* (2013.01); *H01L 29/7397* (2013.01); *H01L 29/7806* (2013.01); *H01L 29/7811* (2013.01); *H01L 29/7813* (2013.01); *H01L 29/8122* (2013.01); *H01L 29/8128* (2013.01); *H01L 29/872* (2013.01); *H01L 21/3065* (2013.01); *H01L 29/0878* (2013.01); *H01L 29/1095* (2013.01); *H01L 29/41766* (2013.01)

(58) Field of Classification Search
  CPC ........... H01L 29/4236; H01L 29/42368; H01L 29/66348; H01L 29/66374; H01L 29/66727; H01L 29/66734; H01L 29/7813; H01L 29/7397; H01L 29/8122; H01L 29/8128; H01L 29/7811
  See application file for complete search history.

(56) References Cited

U.S. PATENT DOCUMENTS

| | | | | |
|---|---|---|---|---|
| 6,987,305 | B2* | 1/2006 | He | H01L 29/7806 257/417 |
| 7,005,347 | B1* | 2/2006 | Bhalla | H01L 27/088 438/259 |
| 7,897,462 | B2* | 3/2011 | Burke | H01L 29/7813 438/270 |
| 8,021,947 | B2* | 9/2011 | Grivna | H01L 29/66719 438/270 |
| 8,034,685 | B1* | 10/2011 | Venkatraman | H01L 29/7813 438/270 |
| 8,247,296 | B2* | 8/2012 | Grivna | H01L 29/7806 438/270 |
| 8,350,318 | B2* | 1/2013 | Grivna | H01L 29/42368 257/329 |
| 8,653,586 | B2* | 2/2014 | Xiao | H01L 29/66712 257/329 |
| 8,664,065 | B2* | 3/2014 | Grivna | H01L 29/7813 438/270 |
| 8,723,238 | B1* | 5/2014 | Padmanabhan | H01L 29/66621 257/288 |
| 8,772,865 | B2* | 7/2014 | Pearse | H01L 29/407 257/331 |
| 8,921,184 | B2* | 12/2014 | Grivna | H01L 29/66719 438/270 |
| 9,356,022 | B2* | 5/2016 | Lee | H01L 27/0629 |
| 9,391,135 | B1* | 7/2016 | Grivna | H01L 21/3043 |
| 9,502,554 | B2* | 11/2016 | Bobde | H01L 29/7808 |
| 9,508,798 | B2* | 11/2016 | Fukuda | H01L 29/0649 |
| 9,614,043 | B2* | 4/2017 | Azam | H01L 21/31053 |
| 9,716,187 | B2* | 7/2017 | Quddus | H01L 29/36 |
| 9,887,287 | B1* | 2/2018 | Lichtenwalner | H01L 29/7811 |
| 10,355,125 | B2* | 7/2019 | Grivna | H01L 29/407 |
| 10,439,075 | B1* | 10/2019 | Quddus | H01L 29/7806 |
| 10,566,466 | B2* | 2/2020 | Quddus | H01L 29/0619 |
| 2002/0134998 | A1* | 9/2002 | Van Dalen | H01L 29/872 257/213 |
| 2003/0178676 | A1* | 9/2003 | Henninger | H01L 29/402 257/340 |
| 2005/0145936 | A1* | 7/2005 | Polzl | H01L 29/7813 257/341 |
| 2005/0167742 | A1* | 8/2005 | Challa | H01L 29/7804 257/328 |
| 2005/0242392 | A1* | 11/2005 | Pattanayak | H01L 29/66734 257/328 |
| 2006/0273386 | A1* | 12/2006 | Yilmaz | H01L 29/7827 257/330 |
| 2007/0221952 | A1* | 9/2007 | Thorup | H01L 29/66734 257/155 |
| 2008/0185643 | A1* | 8/2008 | Hossain | H01L 29/7802 257/342 |
| 2008/0197407 | A1* | 8/2008 | Challa | H01L 29/7831 257/330 |
| 2009/0065814 | A1* | 3/2009 | Bhalla | H01L 29/66734 257/230 |
| 2009/0079002 | A1* | 3/2009 | Lee | H01L 29/66712 257/355 |
| 2009/0090967 | A1* | 4/2009 | Chen | H01L 29/1095 257/330 |
| 2010/0072544 | A1* | 3/2010 | Pearse | H01L 29/7813 257/331 |
| 2010/0140695 | A1* | 6/2010 | Yedinak | H01L 29/0696 257/334 |
| 2010/0187603 | A1* | 7/2010 | Hanaoka | H01L 29/7811 257/330 |
| 2010/0314682 | A1* | 12/2010 | Yilmaz | H01L 29/0661 257/328 |
| 2011/0006363 | A1* | 1/2011 | Hsieh | H01L 29/086 257/330 |
| 2011/0008939 | A1* | 1/2011 | Hsieh | H01L 29/086 438/270 |
| 2011/0136310 | A1* | 6/2011 | Grivna | H01L 29/407 438/270 |
| 2011/0198605 | A1* | 8/2011 | Wang | H01L 29/66727 257/71 |
| 2011/0227151 | A1 | 9/2011 | Hsu et al. | |
| 2011/0291186 | A1* | 12/2011 | Yilmaz | H01L 29/66719 257/334 |
| 2012/0032261 | A1* | 2/2012 | Hsieh | H01L 29/086 257/334 |
| 2012/0122307 | A1 | 5/2012 | Mizushima | |
| 2012/0161225 | A1* | 6/2012 | Li | H01L 29/7811 257/328 |
| 2012/0276703 | A1* | 11/2012 | Grivna | H01L 29/66719 438/270 |
| 2012/0286355 | A1* | 11/2012 | Mauder | H01L 29/7393 257/330 |
| 2012/0326226 | A1* | 12/2012 | Xiao | H01L 29/0878 257/329 |
| 2013/0020635 | A1* | 1/2013 | Yilmaz | H01L 27/088 257/334 |
| 2013/0043526 | A1* | 2/2013 | Iyer | H01L 29/66734 257/330 |
| 2013/0168731 | A1* | 7/2013 | Hsieh | H01L 29/66734 257/140 |
| 2013/0168760 | A1* | 7/2013 | Hsieh | H01L 29/42368 257/330 |
| 2013/0168761 | A1* | 7/2013 | Hsieh | H01L 29/0661 257/330 |
| 2013/0168765 | A1 | 7/2013 | Lin et al. | |
| 2013/0334598 | A1* | 12/2013 | Okumura | H01L 29/66734 257/335 |
| 2014/0015039 | A1* | 1/2014 | Hossain | H01L 29/7813 257/330 |
| 2014/0027840 | A1* | 1/2014 | Guan | H01L 29/0623 257/330 |
| 2014/0264569 | A1* | 9/2014 | Yedinak | H01L 29/0649 257/330 |
| 2014/0312452 | A1 | 10/2014 | Lin | |

(56) References Cited

U.S. PATENT DOCUMENTS

| | | | |
|---|---|---|---|
| 2015/0041816 A1* | 2/2015 | Wood | H01L 29/407 257/71 |
| 2015/0069567 A1 | 3/2015 | Yedinak et al. | |
| 2015/0108569 A1* | 4/2015 | Grivna | H01L 29/7813 257/334 |
| 2015/0137220 A1* | 5/2015 | Li | H01L 29/407 257/330 |
| 2015/0162410 A1* | 6/2015 | Padmanabhan | H01L 29/0878 257/488 |
| 2015/0179752 A1 | 6/2015 | Siemieniec et al. | |
| 2015/0187877 A1 | 7/2015 | Park et al. | |
| 2015/0200250 A1 | 7/2015 | Lin, I et al. | |
| 2015/0349091 A1* | 12/2015 | Yilmaz | H01L 29/4975 438/270 |
| 2015/0380543 A1* | 12/2015 | Zink | H01L 21/76202 257/334 |
| 2016/0043168 A1* | 2/2016 | Ding | H01L 21/31144 257/328 |
| 2016/0064548 A1* | 3/2016 | Laforet | H01L 29/404 257/331 |
| 2016/0064556 A1* | 3/2016 | Qin | H01L 29/407 257/334 |
| 2016/0149034 A1* | 5/2016 | Li | H01L 29/1095 257/330 |
| 2016/0155794 A1* | 6/2016 | Kim | H01L 29/66348 257/139 |
| 2016/0163789 A1* | 6/2016 | Hsieh | H01L 29/66727 257/330 |
| 2016/0260845 A1* | 9/2016 | Quddus | H01L 29/66143 |
| 2016/0284838 A1* | 9/2016 | Qin | H01L 29/402 |
| 2017/0025404 A1* | 1/2017 | Padmanabhan | H01L 29/7823 |
| 2017/0084687 A1* | 3/2017 | Grivna | H01L 21/764 |
| 2017/0110535 A1* | 4/2017 | Yilmaz | H01L 29/1095 |
| 2017/0179225 A1* | 6/2017 | Lee | H01L 29/0634 |
| 2017/0194486 A1* | 7/2017 | Venkatraman | H01L 29/66734 |
| 2017/0213906 A1* | 7/2017 | Li | H01L 29/4236 |
| 2017/0288065 A1* | 10/2017 | Blair | H01L 29/404 |
| 2018/0026094 A1* | 1/2018 | Yilmaz | H01L 27/0823 257/139 |
| 2018/0108737 A1* | 4/2018 | Naito | H01L 29/1087 |
| 2018/0108738 A1* | 4/2018 | Naito | H01L 29/1095 |
| 2018/0204936 A1* | 7/2018 | Lee | H01L 29/1095 |
| 2018/0294332 A1* | 10/2018 | Loechelt | H01L 29/0615 |
| 2018/0315812 A1* | 11/2018 | Yedinak | H01L 29/0623 |
| 2018/0323273 A1* | 11/2018 | Su | H01L 29/8725 |
| 2018/0350962 A1* | 12/2018 | Naito | H01L 21/324 |
| 2018/0358433 A1* | 12/2018 | Su | H01L 29/0623 |
| 2019/0035927 A1* | 1/2019 | Iwaya | H01L 29/0638 |
| 2019/0074367 A1* | 3/2019 | Naito | H01L 29/66136 |
| 2019/0115436 A1* | 4/2019 | Hossain | H01L 29/0696 |
| 2019/0252533 A1* | 8/2019 | Naito | H01L 29/0696 |
| 2019/0326392 A1* | 10/2019 | Deng | H01L 29/868 |
| 2019/0355841 A1* | 11/2019 | Stoib | H01L 29/7397 |
| 2020/0006579 A1* | 1/2020 | Quddus | H01L 21/763 |
| 2020/0083366 A1* | 3/2020 | Venkatraman | H01L 29/7813 |
| 2020/0212218 A1* | 7/2020 | Kim | H01L 29/66734 |

* cited by examiner

INSULATED GATE SEMICONDUCTOR DEVICE HAVING TRENCH TERMINATION STRUCTURE AND METHOD

CROSS-REFERENCE TO RELATED APPLICATIONS

This application claims priority to U.S. Provisional Application No. 62/571,428 filed on Oct. 12, 2017, the content of which is hereby incorporated by reference.

BACKGROUND

The present description relates, in general, to electronics and, more particularly, to semiconductor device structures and methods of forming semiconductor devices.

Insulated gate field effect transistors (IGFETs), such as metal oxide semiconductor field effect transistors (MOSFETs), have been used in many power switching applications, such as dc-dc converters. In a typical MOSFET, a gate electrode provides turn-on and turn-off control with the application of an appropriate gate voltage. By way of example, in an N-type enhancement mode MOSFET, turn-on occurs when a conductive N-type inversion layer (i.e., channel region) is formed in a P-type body region in response to the application of a positive gate voltage, which exceeds an inherent threshold voltage. The inversion layer connects N-type source regions to N-type drain regions and allows for majority carrier conduction between these regions.

There is a class of MOSFET devices in which the gate electrode is formed in a trench extending downward from a major surface of a semiconductor material, such as silicon. Current flow in this class of devices is primarily in a vertical direction through the device, and, as a result, device cells can be more densely packed. All else being equal, the more densely packed device cells can increase the current carrying capability and reduce on-resistance of the device.

Medium and high voltage trench MOSFET devices used in high frequency switch mode power supply (SMPS) applications should exhibit low small-signal output capacitance ($C_{OSS}$) and low on-resistance ($R_{dson}$) to meet desired switching efficiency. Also, the low $R_{dson}$ should be balanced with maintaining desired breakdown voltage ($BV_{DSS}$) and achieving desired ruggedness, such as good unclamped inductive switching (UIS). In the past, it was not understood how to best achieve improved device ruggedness.

Accordingly, it is desirable to have a method and structure that improves device performance including device ruggedness. Also, it is desirable that the method and structure be compatible with existing process flows, avoid having to use expensive process equipment, and have improved process repeatability and yields.

BRIEF SUMMARY

In power semiconductor devices, such as trench MOSFET devices, more robust designs are required in terms of higher UIS (Unclamped Inductive Switching) capability and higher breakdown voltage ($BV_{DSS}$) stability in terms of, for example, walk-in/walk-out phenomenon under reliability stress or under field application. As a typical practice, all power MOSFETs are subjected to UIS testing before they are released to the market to determine that such devices are robust under high voltage and high current avalanche conditions. Such power device avalanche capability can be measured by the amount of energy that the device can absorb for a given time under avalanche conditions to ensure thermal failure rather than defect-related failure.

The authors found through experimentation that UIS robustness depends on what portion of the semiconductor device breaks down first, and whether or not that portion of the semiconductor device that breaks down first is capable of withstanding the UIS event. It was further determined that if termination cells or transition cells break down earlier or at a lower voltage than the active cells, the UIS energy will be distributed at the termination cells, which have a generally smaller area to absorb the UIS energy, and the UIS performance will be impaired. That is, if termination edge cells or transition cells break down earlier or at lower voltage than active cells, the UIS energy will be lower or distributed as termination cells have generally smaller area to absorb all the UIS energy.

In general, the present examples relate to a semiconductor device and a method of forming the semiconductor device having improved UIS robustness while maintaining desired breakdown and on-resistance characteristics. More particularly, a device and method are described that achieve improved UIS performance showing higher and more stable avalanche peak current ($I_{pk}$) tighter $I_{pk}$ distribution across a semiconductor wafer thereby leading to reduced UIS yield loss.

In some examples, active trench structures in an active region of the semiconductor device are separated by active mesa regions. The active trench structures are separated from one or more termination trench structures in a termination region by a transition mesa region of the semiconductor device. The transition mesa region is configured to provide a charge imbalance in the semiconductor device such that breakdown of the semiconductor device occurs in the active region first before breakdown occurs in the termination region of the semiconductor device. In some examples, the charge imbalance is provided by the transition mesa region having a greater width than the active trench mesa regions. In other examples, the charge imbalance is provided by the transition mesa region having a dopant concentration that is higher than the dopant concentration in each of the active mesa regions. In some examples, the semiconductor device comprises a shielded-gate trench MOSFET device. In other examples, the semiconductor device comprises a Schottky rectifier device. In further examples, the semiconductor device comprise a combination of MOSFET structures and Schottky rectifier structures.

More particularly, in one example, a semiconductor device comprises a region of semiconductor material comprising a first conductivity type, an active region, and a termination region. A first active trench structure is disposed in the active region and a second active trench structure is disposed in the active region and is laterally separated from the first active trench by an active mesa region having a first width. A first termination trench structure is disposed in the termination region and separated from the second active trench by a transition mesa region having a second width and a higher carrier charge than that of the active mesa region. In one example, the higher carrier charge is provided by the transition mesa region having a higher dopant concentration of a dopant of the first conductivity type than that of the active mesa region. In another example, the higher carrier charge is provided by the second width being greater than the first width.

In another example, a semiconductor device structure comprises a region of semiconductor material comprising a first conductivity type, a first major surface, a second major surface opposite to the first major, an active region, a termination region, and a transition region interposed between the active region and the termination region. Active trench structures extend from the first major surface into the region of semiconductor material within the active region, wherein the active trench structures are laterally separated from each other by active mesa regions. A termination trench structure extends from the first major surface into the region of semiconductor material within the termination region. A transition mesa region interposed between an outermost one of the active trench structures and the termination trench structure, wherein the transition mesa region comprises a carrier concentration that is higher than that of each of the active mesa regions.

In a further example, a method of forming a semiconductor device comprises providing a region of semiconductor material comprising a first conductivity type, an active region, and a termination region. The method includes providing a first active trench structure disposed in the active region and providing a second active trench structure disposed in the active region and laterally separated from the first active trench by an active mesa region. The method includes providing a first termination trench structure disposed in the termination region and separated from the second active trench by a transition mesa region having a higher carrier charge than that of the active mesa region.

Among other things, the present examples are relevant to semiconductor devices including semiconductor devices having voltage ratings in a range from about 20 volts through about 200 volts or more. Such semiconductor devices can include, but are not limited to trench IGFET devices, trench IGBT devices, trench Schottky rectifier devices, trench thyristors devices, or other power devices. In addition, the present examples, of a benefit of shifting impact ionization more (for example, deeper) into the active region of the semiconductor device so that UIS current remain the active region.

Figure 1:
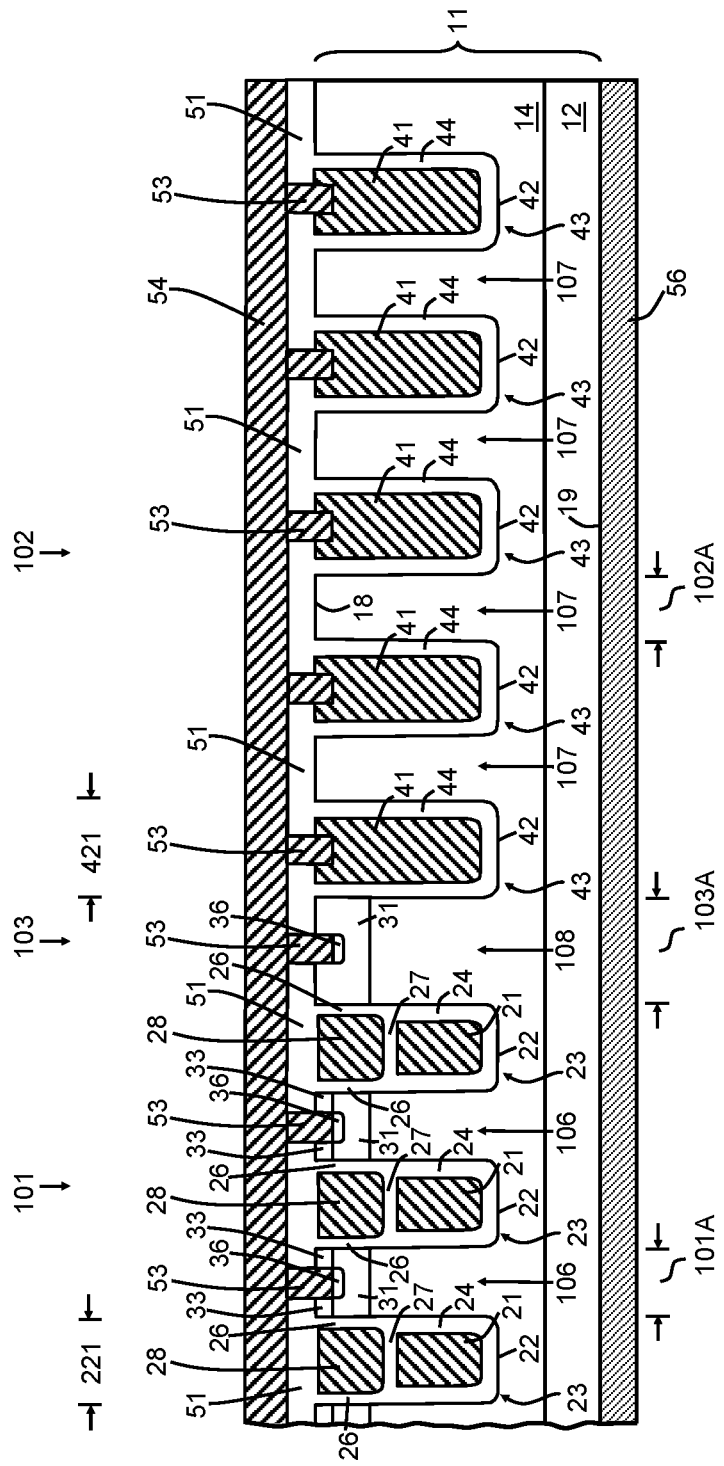
FIG. 1 illustrates a partial cross-sectional view of an example of a semiconductor device in accordance with the present description.

For simplicity and clarity of the illustration, elements in the figures are not necessarily drawn to scale, and the same reference numbers in different figures denote the same elements. Additionally, descriptions and details of well-known steps and elements are omitted for simplicity of the description. As used herein, current-carrying electrode means an element of a device that carries current through the device, such as a source or a drain of an MOS transistor, an emitter or a collector of a bipolar transistor, or a cathode or anode of a diode, and a control electrode means an element of the device that controls current through the device, such as a gate of a MOS transistor or a base of a bipolar transistor. One skilled in the art understands that conductivity type refers to the mechanism through which conduction occurs such as through conduction of holes or electrons, therefore, that conductivity type does not refer to the doping concentration, but the doping type, such as P-type or N-type. Although the devices are explained herein as certain N-type regions and certain P-type regions, a person of ordinary skill in the art understands that the conductivity types can be reversed and are also possible in accordance with the present description, taking into account any necessary polarity reversal of voltages, inversion of transistor type and/or current direction, etc. For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles. Furthermore, the term major surface when used in conjunction with a semiconductor region, wafer, or substrate means the surface of the semiconductor region, wafer, or substrate that forms an interface with another material, such as a dielectric, an insulator, a conductor, or a polycrystalline semiconductor. The major surface can have a topography that changes in the x, y and z directions. As used herein, the term and/or includes any and all combinations of one or more of the associated listed items. In addition, the terminology used herein is for the purpose of describing particular examples only and is not intended to be limiting of the disclosure. As used herein, the singular forms are intended to include the plural forms as well, unless the context clearly indicates otherwise. It will be further understood that the terms comprises, comprising, includes, and/or including, when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately, or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly or wholly coincide or align in the same or different planes. It is further understood that the examples illustrated and described hereinafter suitably may have examples and/or may be practiced in the absence of any element that is not specifically disclosed herein.

DETAILED DESCRIPTION OF THE DRAWINGS

FIG. 1 illustrates a partial cross-sectional view of a semiconductor device 10 or a device 10 in accordance with a first example configured, among other things, to improve UIS performance. In the present example, device 10 is illustrated as shielded-gate trench MOSFET device having active region 101 or active portion 101 where active cells or active structures are provided, and a termination region 102 or termination portion 102 where termination cells or termination structures are provided. In most examples, termination region 102 is disposed proximate to a peripheral or edge portion of device 10, and active region 101 is disposed in a central portion of device 10 surrounded by termination region 102. In the present example, active trench structures 23, shielded-gate trench structures 23, or trench control structures 23 are disposed within active region 101, and one or more termination trench structures 43 are disposed within the termination region 102. In accordance with the present example, device 10 includes transition region 103, a transition portion 103, or transition cell 103 interposed between an outermost one of active trenches 23 and an innermost one of termination trench structures 43. In most examples, termination trench structures 43 completely surround active trench structures 23 in a top plan view. In accordance with the present embodiment, transition region 103 is configured with increased carrier charge to improve the UIS capability of device 10 as will be described hereinafter.

In some examples, device 10 includes a region of semiconductor material 11, semiconductor substrate 11, or semiconductor region 11, which can include, for example, an N-type silicon substrate 12 having a resistivity ranging from about 0.001 ohm-cm to about 0.005 ohm-cm. By way of example, substrate 12 can be doped with phosphorous, arsenic, or antimony. In the example illustrated, substrate 12 provides a drain region, drain contact, or a first current carrying contact for device 10.

In some examples, a semiconductor layer 14, drift region 14, or extended drain region 14 is formed in, on, or overlying substrate 12. In one example, semiconductor layer 14 is formed using epitaxial growth techniques or similar techniques. Alternatively, semiconductor layer 14 is formed using conventional doping and diffusion techniques. In an example suitable for a 50 volt device, semiconductor layer 14 is N-type with a dopant concentration of about $1.0 \times 10^{16}$ atoms/cm$^3$ and has a thickness from about 3 microns to about 5 microns. The thickness and dopant concentration of semiconductor layer 14 is increased or decreased depending on the desired drain-to-source breakdown voltage ($BV_{DSS}$) rating of device 10. The dopant profile of semiconductor layer 14 can be a substantially uniform dopant profile over its thickness, or the dopant profile can be non-uniform (for example, the dopant profile can increase/decrease) over its thickness.

It is understood that region of semiconductor material 11, semiconductor substrate 12, and/or semiconductor layer 14 (or portions thereof) can include other types of materials including, but not limited to, heterojunction semiconductor materials, and semiconductor substrate 12 and semiconductor layer 14 can each comprise different materials. Such materials can include SiGe, SiGeC, SiC, GaN, AlGaN, and other similar materials as known to those skilled in the art. In an alternate example, the conductivity type of substrate 12 (or a portion thereof) is switched to be opposite the conductivity type of semiconductor layer 14 to form, for example, an insulated gate bipolar transistor (IGBT) embodiment.

Device 10 also includes a body region 31, body region portions 31, base region 31, P-type high voltage (PHV) region 31, doped region 31, or doped regions 31 extending from a major surface 18 of semiconductor material 11. In some examples, body region 31 comprises a continuous or interconnected doped region. In other examples, body region 31 comprises a plurality of separated doped regions. Body regions 31 have a conductivity type that is opposite to the conductivity type of semiconductor layer 14. In this example, body regions 31 comprise P-type conductivity when semiconductor layer 14 comprises N-type conductivity. Body regions 31 have a dopant concentration suitable for forming inversion layers that operate as conduction channels or channel regions of device 10. Body regions 31 extend from major surface 18 to a depth, for example, from about 0.3 microns to about 2.0 microns. N-type source regions 33, current conducting regions 33, or current carrying regions 33 are formed within, in, or overlying body regions 31 and extend from major surface 18 to a depth, for example, from about 0.1 microns to about 0.5 microns. A P-type body contact region 36 or body contact region 36 can be formed in body regions 31, and is configured to provide a lower contact resistance to body regions 31. In some examples, source regions 33 are not provided in or are absent from transition region 103 as illustrated in FIG. 1. In some examples, the dopant concentration and/or dopant profile of base region 31 disposed within transition mesa region 108 can be different than the dopant concentration and/or dopant profile of base regions 31 in active mesa regions 106.

In some examples, active trench structures 23 are configured as shielded-gate trench structures and comprise trenches 22 or active trenches 22 extending from major surface 18 into semiconductor material 11, dielectric structures 24 disposed adjacent to lower surfaces of trenches 22, and conductive electrodes 21 or shield electrodes 21 disposed adjacent to dielectric structures 24 in substantially centrally located portions of trenches 22. In some examples, trenches 22 terminate within semiconductor layer 14. In other examples, trenches 22 extend through semiconductor layer 14 into substrate 12. Trenches 22 can be formed using masking and etching processes. In one example, trenches 22 can be etched using plasma etching techniques with a fluorocarbon chemistry or a fluorinated chemistry (for example, $SF_6/O_2$) or other chemistries or removal techniques as known to those skilled in the art. In some examples, trenches 22 have a width 221 from about 0.2 microns to about 2.0 microns.

Dielectric structures 24 comprise one or more dielectric layers or insulating layers disposed adjacent to side and lower surfaces of trenches 22, and are configured to separate shield electrodes 21 from semiconductor material 11. For example, dielectric structures 24 can comprise an oxide, a nitride, combinations thereof, or similar materials as known to those skilled in the art. In one example, dielectric structures 24 comprises a silicon oxide having a thickness from about 0.1 microns through about 1.0 micron. Dielectric structures 24 can have a substantially uniform thickness, or they can have a variable thickness. For example, dielectric structures 24 can be thicker proximate to the lowest surfaces of trenches 22 and thinner adjacent to the lower sidewall surfaces of trenches 22. In other examples, dielectric structures 24 can be thinner proximate to the lowest surfaces of trenches 22 and thicker adjacent to the lower sidewall surfaces of trenches 22. Additionally, the thickness of layer 24 may be increased or decreased, depending on the desired drain-to-source breakdown voltage ($BV_{DSS}$). Dielectric structures 24 can be formed using thermal oxidation processes, dry oxidation processes, chemical vapor deposition processes, or other similar processes as known to those skilled in the art.

In some examples, shield electrodes 21 comprise doped polycrystalline semiconductor material, such as doped polysilicon. Shield electrodes can be doped with one or more N-type or P-type dopants. In other examples, shield electrodes 21 can comprise other conductive materials as known to those skilled in the art. Shield electrodes 21 are configured to, among other things, reduce gate-to-drain capacitance. Shield electrodes 21 can be formed using chemical vapor deposition processes or other processes as known to those skilled in the art.

Dielectric structures 26 are formed adjacent to upper sidewall portions of trenches 22 and are configured as gate dielectric regions or layers. In some examples, dielectric structures 26 can comprise oxide, nitride, tantalum pentoxide, titanium dioxide, barium strontium titanate, combinations thereof, or similar materials as known to those skilled in the art. In some examples, dielectric structures 26 are silicon oxide and have a thickness from about 0.01 microns to about 0.2 microns. In one example, dielectric structures 24 are thicker than dielectric structures 26. Dielectric structures 27 are formed overlying upper surfaces of shield electrodes 21. In some examples, dielectric structures 27 comprise materials similar to dielectric structures 24 and have a thickness between the thickness of dielectric structures 24 and dielectric structures 26. In one example, dielectric structures 27 have a thickness greater than the thickness of dielectric structures 26, which improves oxide breakdown voltage performance. Dielectric structures 26 and 27 can be formed using thermal oxidation processes, dry oxidation processes, chemical vapor deposition processes, or other processes as known to those skilled in the art.

Active trench structures 23 further include control electrodes or gate electrodes 28, which are formed adjacent to dielectric structures 26 and 27. In some examples, gate electrodes 28 comprise doped polycrystalline semiconductor material, such as polysilicon doped with an N-type dopant, and can be formed using chemical vapor deposition processes or other processes as known to those skilled in the art. Planarization processes can be used to planarize upper surfaces of gate electrodes 28 as generally illustrated in FIG. 1. In other examples, the upper surfaces of gate electrodes 28 can be recessed below major surface 18.

Termination trench structures 43 comprise one or more trenches 42 or termination trenches 42 extending from major surface 18 into semiconductor material 11. In some examples, trenches 42 terminate within semiconductor layer 14. In other examples, trenches 42 extend through semiconductor layer 14 into substrate 12. In some examples, one or more of trenches 42 have the same depth as trenches 22. In other examples, one or more of trenches 42 have a depth that is different (for example, deeper or shallower) than the depth of trenches 22. Trenches 42 can be formed using masking and etching processes. In one example, trenches 42 can be etched using plasma etching techniques with a fluorocarbon chemistry or a fluorinated chemistry (for example, $SF_6/O_2$) or other chemistries or removal techniques as known to those skilled in the art. In some examples, trenches 22 and 42 are formed at the same time. In some examples, trenches 42 have a width 421 from about 0.2 microns to about 2.0 microns. In the present example, each trench 42 can be provided with a similar width. In most embodiments using multiple termination trenches 42, at least three termination trenches 42 can be used for medium voltage devices (for example, about 50 V to about 200 V device). In some examples, three to five termination trenches 42 can be used for medium voltage devices. Additional termination trenches 42 can be used for higher voltage devices (for example, greater than 100 V devices). In most examples, termination trenches 42 comprises continuous (that is, no breaks in the individual termination trenches) ring-like structures that completely surround active region 101. In accordance with the present description, termination trench structures 43 are configured together with the configuration of transition mesa region 108 to ensure breakdown occurs in active region 101 where UIS energy is more efficiently distributed in device 10.

Dielectric structures 44 are formed adjacent to upper and lower surfaces of trenches. In some examples, dielectric structures 44 comprise an oxide, a nitride, combinations thereof, or other dielectric materials as known to those skilled in the art. In one example, dielectric structures 44 comprise a silicon oxide having a thickness from about 0.1 microns through about 1.0 micron. Dielectric structures 44 can have a substantially uniform thickness, or they can have a variable thickness. For example, dielectric structures 44 can be thicker proximate to the lowest surfaces of trenches 42 and thinner adjacent to the upper sidewall surfaces of trenches 42. In other examples, dielectric structures 44 can be thinner proximate to the lowest surfaces of trenches 42 and thicker adjacent to the upper sidewall surfaces of trenches 42. Dielectric structures 44 can be formed using thermal oxidation processes, dry oxidation processes, chemical vapor deposition processes, or other similar processes as known to those skilled in the art. In some examples, dielectric structures 44 can be formed at the same time as dielectric structures 24.

Termination electrodes 41 are disposed adjacent to dielectric structures 44 and, in some examples, fill or substantially fill termination trenches 42. In some examples, termination electrodes 41 comprise doped polycrystalline semiconductor material, such as polysilicon doped with an N-type polysilicon. In some examples, termination electrodes 41 are formed using chemical vapor deposition processes or similar processes as known to those skilled in the art. Termination electrodes 41 can be formed at the same time as shield electrodes 21 or gate electrodes 28. Masking techniques can be used to control the difference in vertical thickness or height between shield electrodes 21 and termination electrodes 41.

An interlayer dielectric (ILD) structure 51 or dielectric structure 51 is formed overlying major surface 18, portions of transition region 103, and active trench structures 23 and termination trench structures 43. In some, dielectric structure 51 comprises a silicon oxide and has a thickness from about 0.4 microns to about 1.0 micron. In one example, dielectric structure 51 comprises a deposited silicon oxide doped with phosphorous or boron and phosphorous. In some examples, dielectric structure 51 is planarized to provide a more uniform surface topography, which improves manufacturability.

Conductive regions or plugs 53 are formed through openings or vias in dielectric structure 51 and portions of semiconductor layer 14 to provide for electrical contact to source regions 33, body regions 31 through contact regions 36, and termination electrodes 41. In one embodiment, conductive regions 53 are conductive plugs or plug structures. In one embodiment, conductive regions 53 comprise a conductive barrier structure or liner plus a conductive fill material. In one embodiment, the barrier structure includes a metal/metal-nitride configuration such as titanium/titanium-nitride or the like. In another embodiment, the barrier structure further includes a metal-silicide structure. In one embodiment, the conductive fill material includes tungsten. In one embodiment, conductive regions 53 are planarized to provide a more uniform surface topography.

A conductive layer 54 is formed overlying major surface 18 and a conductive layer 56 is formed overlying a major surface 19 of semiconductor material 11 opposite major surface 18. Conductive layers 54 and 56 are configured to provide electrical connection between the individual device components of device 10 and a next level of assembly. In one example, conductive layer 54 comprises titanium/titanium-nitride/aluminum-copper or other conductive materials as known to those skilled in the art, and is configured as a source electrode or terminal. In one example, conductive layer 56 comprises a solderable metal structure such as titanium-nickel-silver, chromium-nickel-gold, or similar materials as known to those skilled in the art, and is configured as a drain electrode or terminal. In one example, a further passivation layer (not shown) is formed overlying conductive layer 54. In one embodiment, shield electrodes 21 are connected (in another plane) to conductive layer 54 so that shield electrodes 21 are configured to be at the same potential as source regions 33 and base regions 31 when device 10 is in use. In another example, shield electrodes 21 are configured to be independently biased or can be configured as floating structures. In accordance with the present example, transition mesa region 108 is provided with a base region 31 that is electrically connected to conductive layer 54. In some examples, the base region 31 disposed in transition mesa region 108 is provided absent source regions 33, but can be provided with a body contract region 36 as generally illustrated in FIG. 1.

Related devices in the 20 volt to 200 volt range typically use a single termination trench to block all of the applied reverse voltage. Device 10 is different in that it utilizes multiple termination trench structures 43 (for example, 3 to 5), and each termination trench structure 43 takes some of the applied reverse voltage. That is, each of termination trench structures 43 takes a lower voltage (compared to the single trench termination) resulting in less impact ionization and lower electric field at the trench sidewall. This provides, among other things, a higher $BV_{DSS}$ and the dielectric structure 44 is under less electrical stress.

Figure 2:
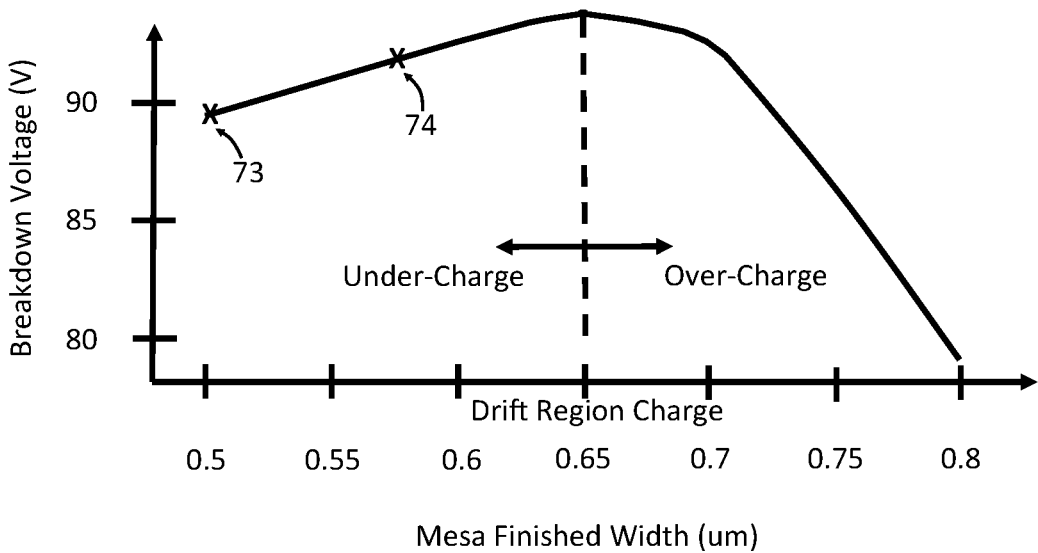
FIG. 2 is a graph illustrating a charge balance curve in accordance with the present description.

FIG. 2 is a graphical representation of a charge balance curve in accordance with the present description representing drift region charge. The y-axis is breakdown voltage in volts, and the x-axis is mesa finished width in microns. Data point 73 is an example of a preferred location on the charge balance curve for active mesa regions 106, and data point 74 is a an example of a preferred location on the charge balance curve for transition mesa region 108 in accordance with the present description. Typical shielded-gate trench MOSFET devices are charge-balanced structures that require a delicate balance of drift region (e.g., semiconductor layer 14) carrier charge all across a semiconductor device or die, including the active cells, the transition cell(s), and the termination cell(s), for the best tradeoff of breakdown voltage, $BV_{DSS}$ and on-resistance, $R_{DS(ON)}$. The authors found through experimentation that even though a balanced-charge all across the semiconductor device has the best tradeoff in terms of higher breakdown voltage and lower on-resistance, it has a penalty of poor UIS performance. The authors determined that UIS robustness or higher UIS energy capability of the semiconductor device depends on what portion of the semiconductor device breaks down first, and whether or not that portion of the semiconductor device is capable of withstanding the high current and high voltage for a given avalanche duration. The authors determined that if the termination edge cell(s) or the transition cell(s) break down earlier or at a lower voltage than the active cells, peak current, $I_{pk}$ or the UIS energy will be lower as termination or transition cells have generally smaller area and little or no body or source contacts to absorb all the UIS energy. The authors further determined that in order to achieve a more robust design, it is beneficial to promote that breakdown occurs at the active cells (which include source/body contact regions) to absorb all or substantially all of the currents during a UIS event—for example. Furthermore, the authors determined that the optimal point in terms of $BV_{DSS}$ and UIS robustness is to introduce a carrier charge imbalance towards the left-hand side of a charge-balanced drift region curve with the active cells having a lower $BV_{DSS}$ than the termination cell and transition cells. In addition, the authors determined that it is beneficial to keep a breakdown voltage margin for the active, termination, and transition cells to go up in $BV_{DSS}$ to reach the peak or the plateaued $BV_{DSS}$ before breakdown voltage falls off the charge-balance curve in the event that there is too large an increase in semiconductor (for example, silicon) carrier charge due to the injection of holes into the shield-oxide under reliability stress or long term field use.

In accordance with the present example, an imbalance of carrier charges in the active and termination cells is provided to improve UIS performance. In a first example, the active cells comprising the structures in active region 101 are deliberately more under-charged (that is, more to the left on the charge balance curve as illustrated in FIG. 2) than the termination cells comprising the structures in termination region 102, which is achieved by an increased mesa width 103A of transition mesa region 108 in device 10. More particularly, width 103A of transition mesa region 108 between the outermost active trench 22 and the innermost termination trench 42 is greater than width 101A or spacing 101A of active mesa regions 106 between adjacent active trenches 22 in active region 101, and in the present example, width 103A is greater than widths 102A of termination mesa regions 107 between each of the adjacent to termination trenches 42 in termination region 102. In some examples, width 101A is in a range from about 0.3 micron to about 1.0 micron, width 102A is in a range from about 0.3 microns to about 1.0 micron, and width 103A is in a range from about 0.4 microns to about 1.1 microns. In this configuration, transition mesa region 108 is provided with a higher carrier charge (where carrier charge (e.g., in atoms/cm$^2$) is defined as width multiplied by dopant concentration) than that of active mesa regions 106 in active region 101, which pushes the breakdown in the termination region 102 of device 10 to be higher than the breakdown of active region 101.

Figure 3:
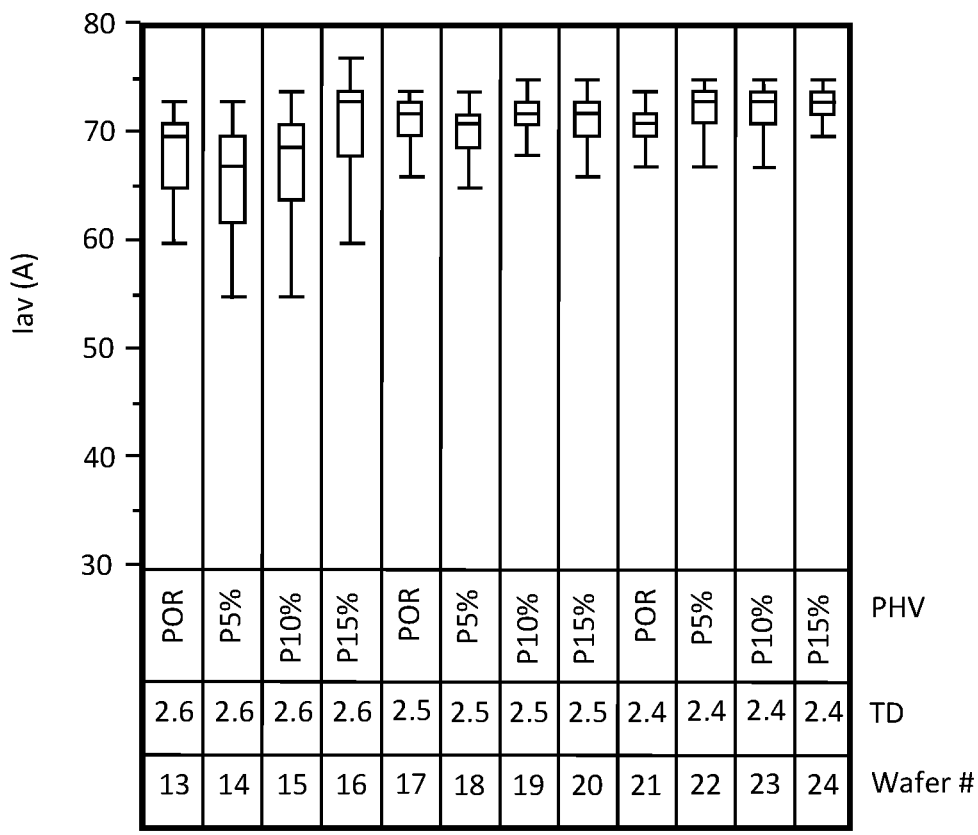
FIGS. 3, 4, and 5 are charts illustrating comparative results of example semiconductor devices in accordance with the present description and prior semiconductor devices.
Figure 4:
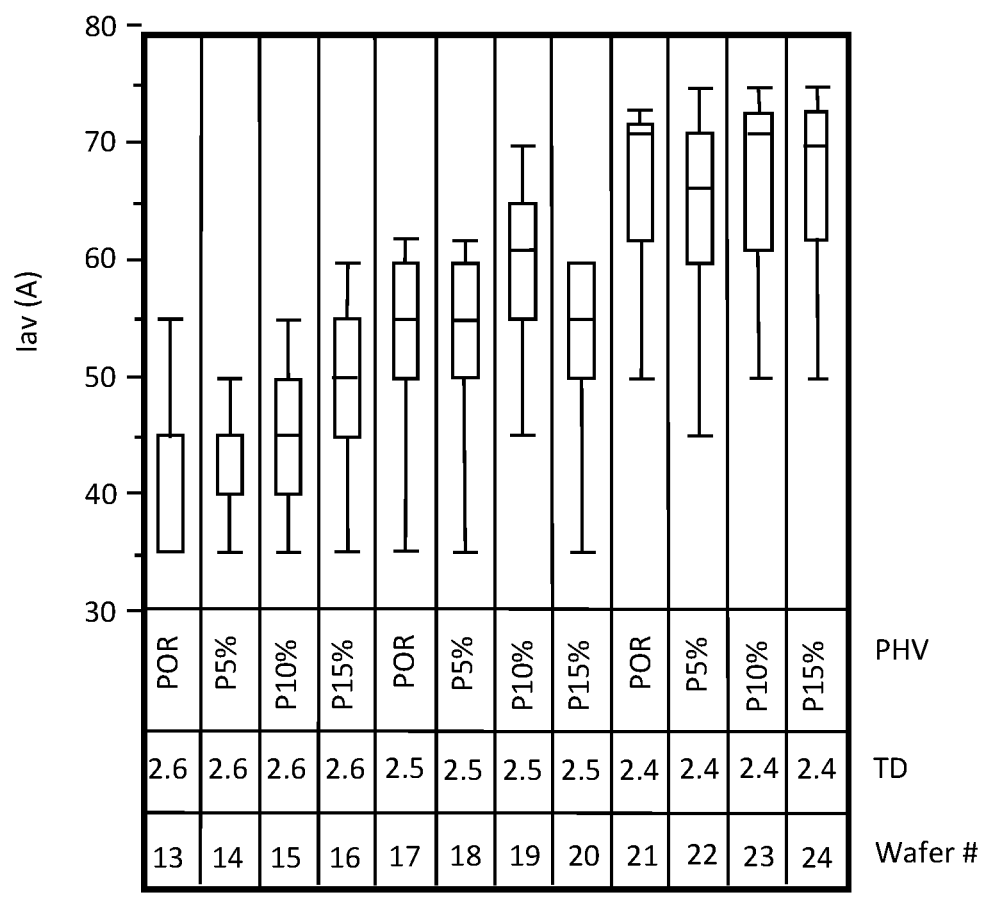
Figure 5:
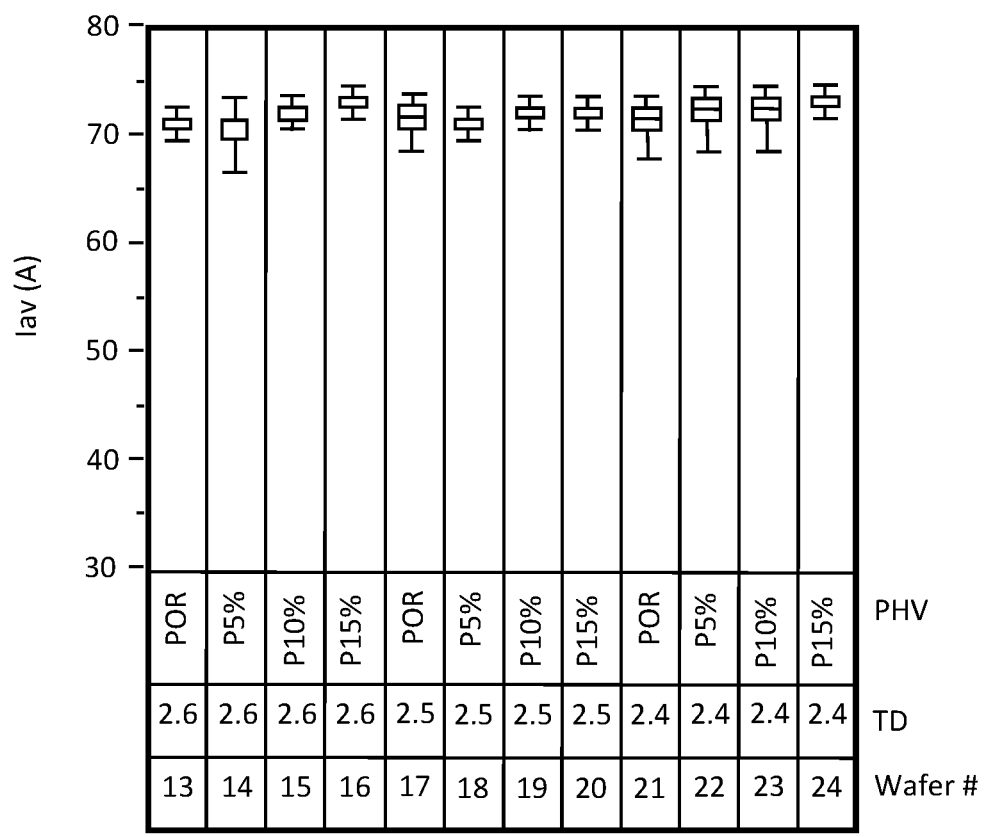

A typical technique for a UIS test is to ramp up drain current in a smaller increments under a predetermined inductor and bias voltage until the device fails, and the current prior to the failing current is defined as the peak current, $I_{pk}$ or the maximum avalanche current, $I_{av}$ capability of the device, which represents the UIS or avalanche energy capability of the device. FIGS. 3, 4, and 5 are charts illustrating comparative results for maximum avalanche current, $I_{av}$ (Amps) for three different devices. Specifically, FIG. 3 is a box and whisker chart for a device similar to device 10 except width 103A is the same as widths 101A and 102A. FIG. 3 also illustrates $I_{av}$ comparing slight increases (for examples, increased by 5%, 10%, and 15%) in the ion implantation dosage used to form base region 31 or PHV region 31 compared to the process of record (POR). FIG. 3 further illustrates $I_{av}$ for different trench depths for active trenches 22. FIG. 4 is a box and whisker chart similar to FIG. 3 for device similar to device 10 with width 103A less than widths 101A and 102A. FIG. 5 is a box and whisker chart similar to FIG. 3 for a device 10 with width 103A greater than widths 101A and 102A in accordance with the present description.

The lay data of FIGS. 3, 4, and 5 shows that higher $I_{av}$ and tighter distributions were achieved when width 103A of transition mesa region 108 is wider than at least width 101A of active mesa regions 106, which provided the lowest UIS related yield loss (FIG. 5). In addition, the lowest and more widely distributed $I_{av}$ was observed when the transition mesa region (e.g., mesa region 108) was narrower than the active mesa regions (for example, mesa regions 106), contributing to significant UIS yield loss (FIG. 4). It was further observed (for the case of FIG. 5) that active trench depth and PHV ion implantation dose had minimal impact on UIS distribution when active trench depth and PHV dose are already optimized in the process for desired breakdown voltage ($BV_{DSS}$), threshold voltage ($V_{th}$), and on-resistance ($R_{DS(ON)}$).

In addition, the above described devices were measured to determine $BV_{DSS}$ distribution with respect to trench depth, PHV body dose, and transition mesa region width variations. It was observed that a narrower transition mesa region width (that is, width 103A of mesa region 108 less than widths 101A of active mesa regions 106) and the shallower active trench depths had the lowest $BV_{DSS}$ comparatively. Further, technology computer aided design (TCAD) impact ionization rates and locations for the three different transition mesa region width configurations described showed that the impact ionization rates and locations is beneficially moved from the last mesa towards the active cells, as the last mesa width (that is, width 103A) transitions from narrower mesa width to equal mesa width, and then to wider mesa width with respect to the active mesa width (that is, width 101A), thus validating the findings observed in the experimental data provided in FIG. 5.

Figure 6:
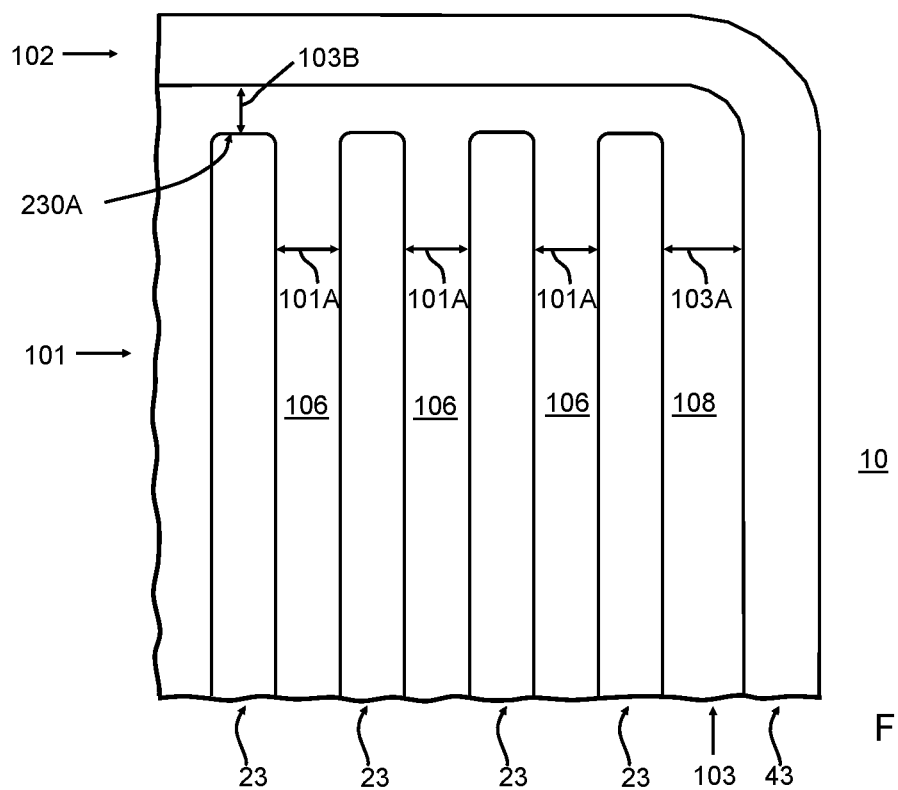
FIG. 6 illustrates a partial top plan view of an example of a semiconductor device in accordance with the present description.

FIG. 6 illustrates a partial top plan view of device 10 having active trench structures 23 disposed in active region 101 and one of termination trench structures 43 disposed in termination region 102. The innermost ones of active trench structures 23 are each separated by mesa regions 106 having widths 101A, and an outermost one of active trenches 23 is separated from an innermost one of termination trench structures 43 by mesa region 108 have width 103A greater than width 101A. In some examples, width 103A is greater than width 101A by about 5% to 50%. In some preferred examples, width 103A is greater than width 101A by about 20%. In some examples, tip regions 230A of active trench structures 23 are separated from the innermost one of termination trench structures 43 by a width 103B that can be different than width 103A. In some examples, width 103B is less than width 103A. In some examples, width 103B is less than widths 103A and 101A. Stated a different way, mesa region 108 as a first width 103A in a first direction that is orthogonal to the lengthwise direction of active trench structures 23, and a second width 103B in a second direction that is generally orthogonal to the first direction as generally illustrated in FIG. 6, which is less than first width 103A.

Figure 7:
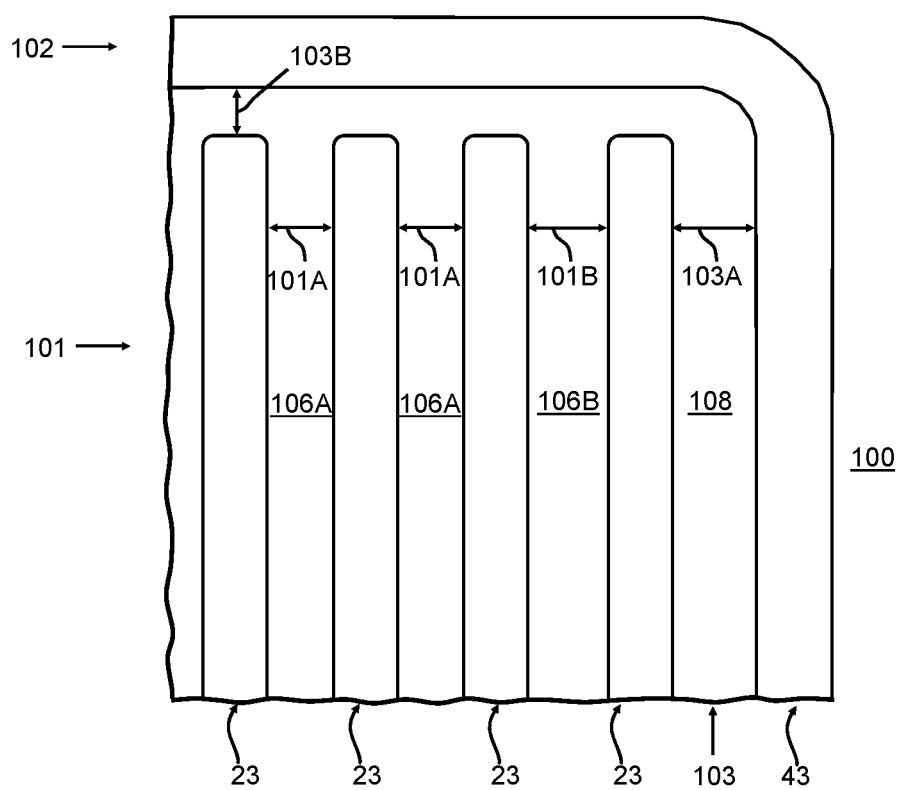
FIG. 7 illustrates a partial top plan view of an example of a semiconductor device in accordance with the present description.

FIG. 7 illustrates a partial top plan view of device 100 in accordance with another example. Device 100 is similar to device 10 and only the differences will be described hereinafter. In device 100, a mesa region 106B or transition active mesa region 106B is disposed between the outermost active trench structure 23 and the second outermost active trench structure 23 that has width 101B that is greater than width 101A of mesa regions 106A. In some examples, mesa region 108 has width 103A that is greater than widths 101A of active mesa regions 106A. In some examples, width 103A is also greater than width 101B. In other examples, width 103A and width 101B can be substantially equal. In device 100, a more gradual transitioning from narrower active mesa regions 106A to mesa region 108 is provided by mesa region 106B to achieve a lower $BV_{DSS}$ within the active region 101 to a higher $BV_{DSS}$ in transition region 103 and termination region 102.

Figure 8:
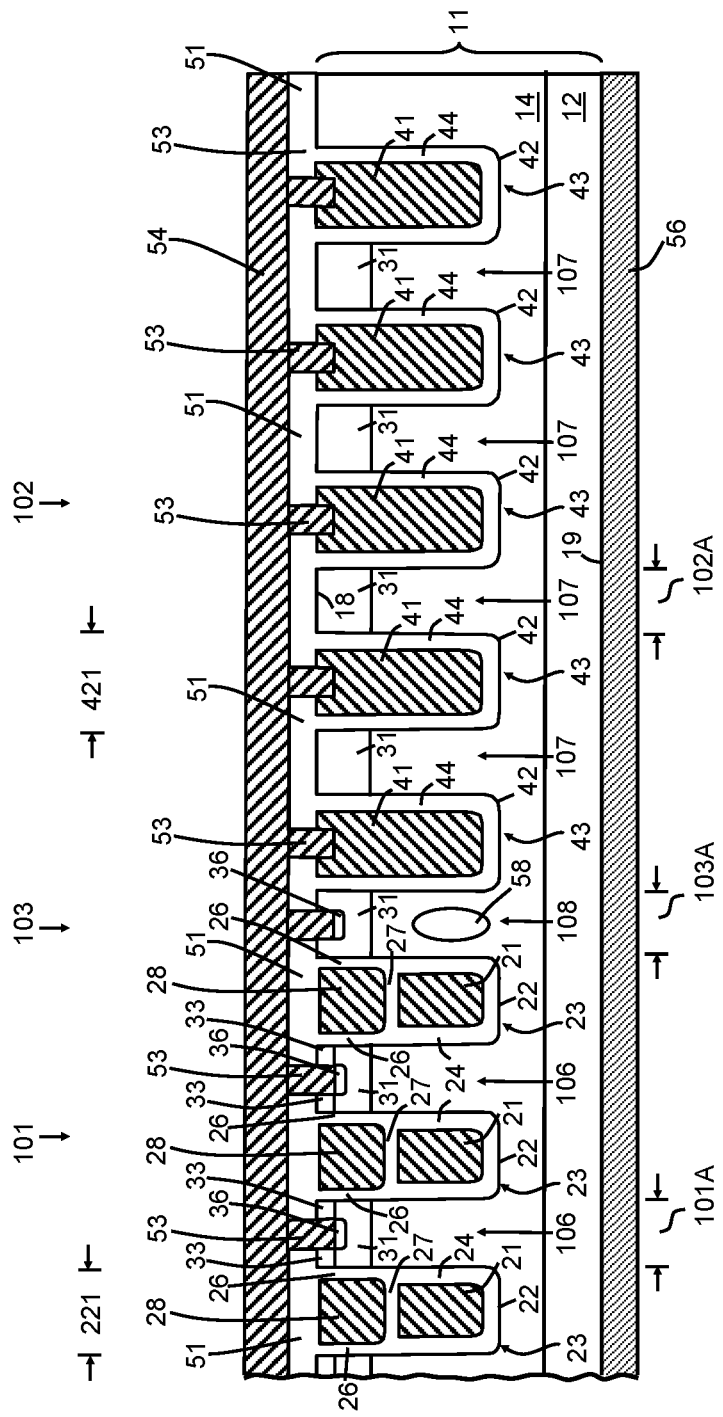
FIG. 8 illustrates a partial cross-sectional view of an example of a semiconductor device in accordance with the present description.

FIG. 8 illustrates a partial cross-sectional view of a semiconductor device 110 or device 110 in accordance with another example configured, among other things, to improve UIS performance. Device 110 is similar to device 10 and only the differences will be described hereinafter. Similar to device 10, transition region 103 is configured with increased carrier charge to improve the UIS capability of device 110. In device 110, width 103A of transition mesa region 108 is substantially equal to width 101A of active mesa regions 106. In some examples, width 103A is substantially equal to width 102A of termination mesa regions 107. In accordance with the present example, instead of increasing the width 103A of transition mesa region 108 to provide an increased carrier charge in transition region 103, the dopant concentration is selectively increased in transition mesa region 108 by including, for example, a doped region 58 comprising an N-type dopant and having a dopant concentration greater than the dopant concentration of semiconductor layer 14. In some examples, masking and ion implantation processes are used to form doped region 58, which can be spaced apart from major surface 18 and below base region 31 in transition mesa region 108. In some examples, doped region 58 can have a peak dopant concentration that is about 5% to about 50% greater than the dopant concentration of semiconductor layer 14. In some preferred examples, doped region 58 can have a peak dopant concentration that is about 20% greater than the dopant concentration of semiconductor layer 14.

In some examples, device 110 includes base regions 31 or PHV regions 31 in termination region 102, which are configured as electrically floating regions (for example, no direct electrical contact to conductive layers 54 or 56). In other examples, base regions 31 are not included in termination region 102. In some examples, dielectric structures 44 have a similar thickness to dielectric structures 24. In other examples, dielectric structures 44 can be thicker than dielectric structures 24. It is understood that doped region 58 may comprises multiple doped regions with different dopant concentrations. It is understood that doped region 58 can also be included in any of the examples illustrated herein in combination with an increased width 103A in transition mesa region 108, or with a width 103A that is similar to widths 101A. Similar to device 10, device 110 includes a base region 31 in transition mesa region 108, which is electrically connected to conductive layer 54. In addition, the base region 31 disposed in transition region 103 can be provided absent source region 33, but can include a body contact region 36.

Figure 9:
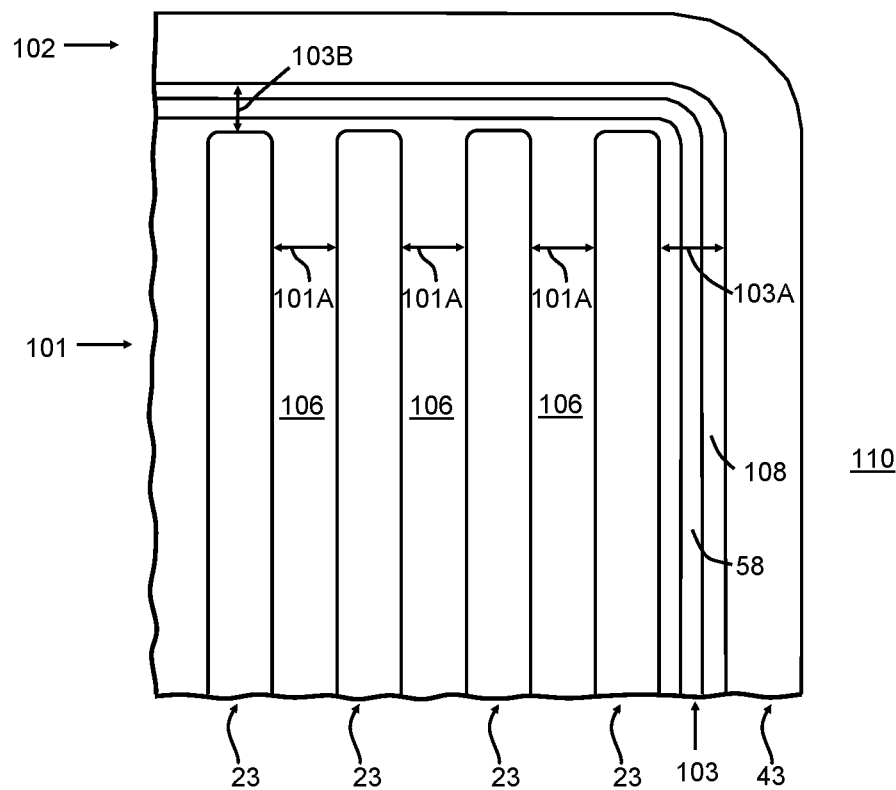
FIG. 9 illustrates a partial top plan view of an example of a semiconductor device in accordance with the present description.

FIG. 9 illustrates a partial top plan view of device 110 having active trench structures 23 disposed in active region 101 and one of termination trenches 43 disposed in termination region 102. As set forth previously, in device 110 width 103A of transition mesa region 108 is substantially equal to width 101A of active mesa regions 106. To increase the carrier charge in transition mesa region 108 doped region 58 is provided within transition mesa region 108 as described previously.

Figure 10:
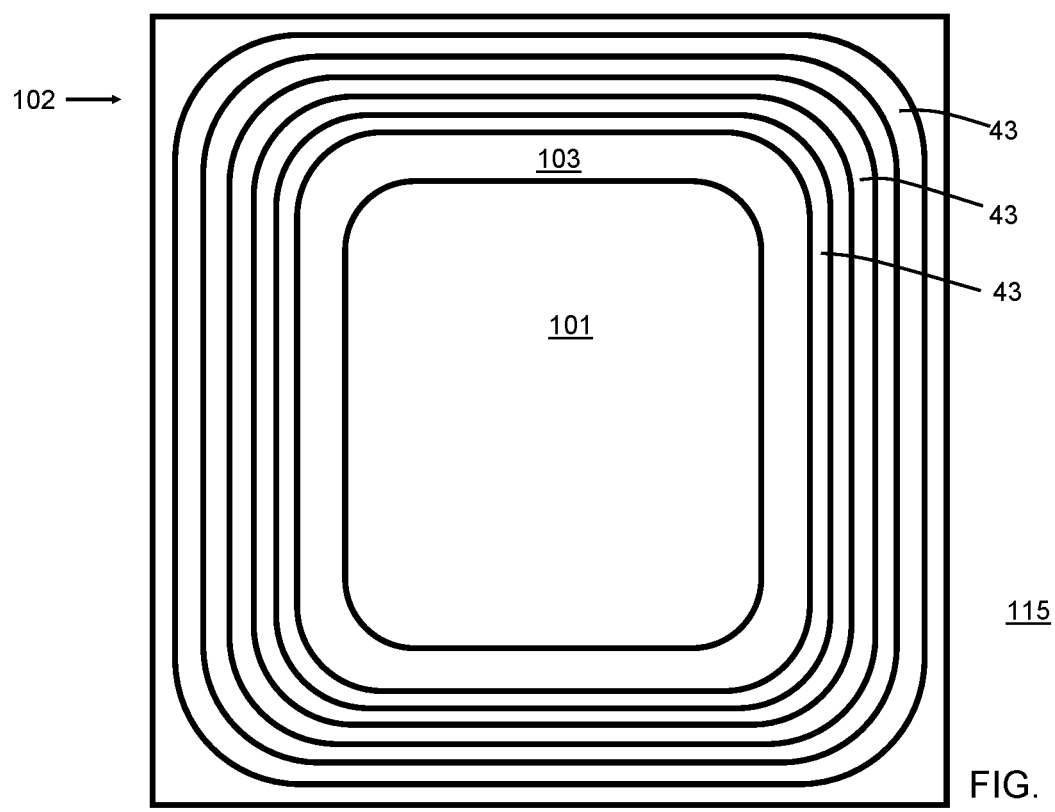
FIG. 10 illustrates a top plan view of an example of a semiconductor device in accordance with the present description.

FIG. 10 illustrates a top plan view of a device 115 in accordance with the present description. More particularly, FIG. 10 provides an example illustration of a plurality of termination trench structures 43 disposed in termination region 102 that completely surround or completely laterally encompass active region 101 and transition 103 without breaks or discontinuities in accordance with the present description.

Figure 11:
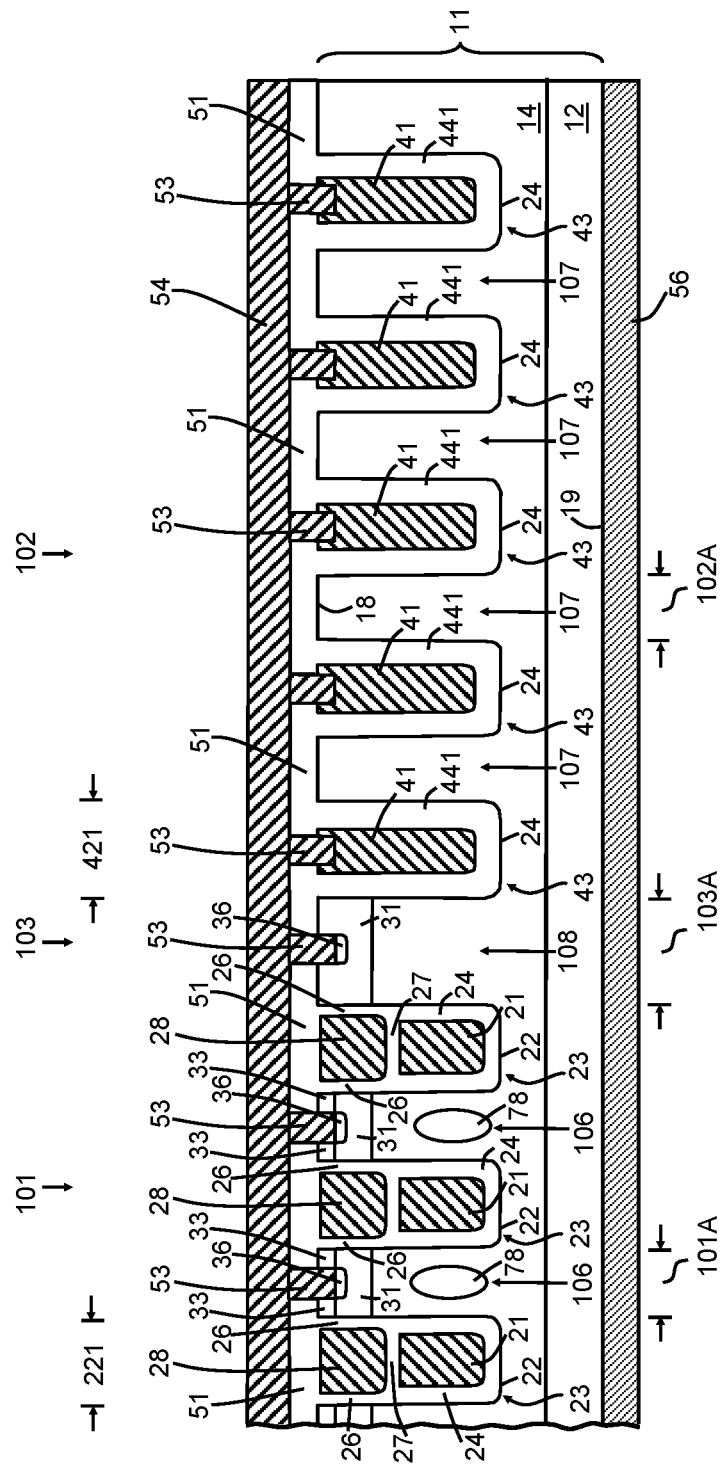
FIGS. 11-21 illustrates partial cross-sectional view of examples of semiconductor devices in accordance with the present description; are charts illustrating comparative results of example semiconductor devices in accordance with the present description and prior semiconductor devices.

FIG. 11 illustrates a partial cross-sectional view of a semiconductor device 120 or device 120 in accordance with a further example configured, among other things, to improve UIS performance. More particularly, transition region 103 is configured with increased carrier charge to improve the UIS capability of device 120. For example, width 103A of transition mesa region 108 is greater than width 101A of active mesa regions 106 and greater than width 102A of termination mesa regions 107. Device 120 is similar to device 10 and only the differences will be described hereinafter. In device 120 dielectric structures 441 disposed in termination trenches 43 have a greater thickness than that of dielectric structures 24 in active trenches 23. One advantage of this configuration is that the dopant concentration in semiconductor layer 14 can be increased, which lowers on-resistance. In some examples, the thickness of dielectric structures 441 is about 25% to about 100% greater than the thickness of dielectric structures 24. In some examples, the depth of active trenches 22 and termination trenches 42 are similar. In other examples, the depths of one or more termination trenches 42 can be different than that of active trenches 22. In other examples, the depths of one or more termination trenches 42 can be different than that of active trenches 22. In some examples, the dopant concentration is increased (for example, by one or more ion implantations) in the active mesa regions 106 to lower on-state resistance for increased current conduction as illustrated by doped regions 78 in FIG. 11. It is understood that doped region 78 are optional and can be included in other examples illustrated herein.

Figure 12:
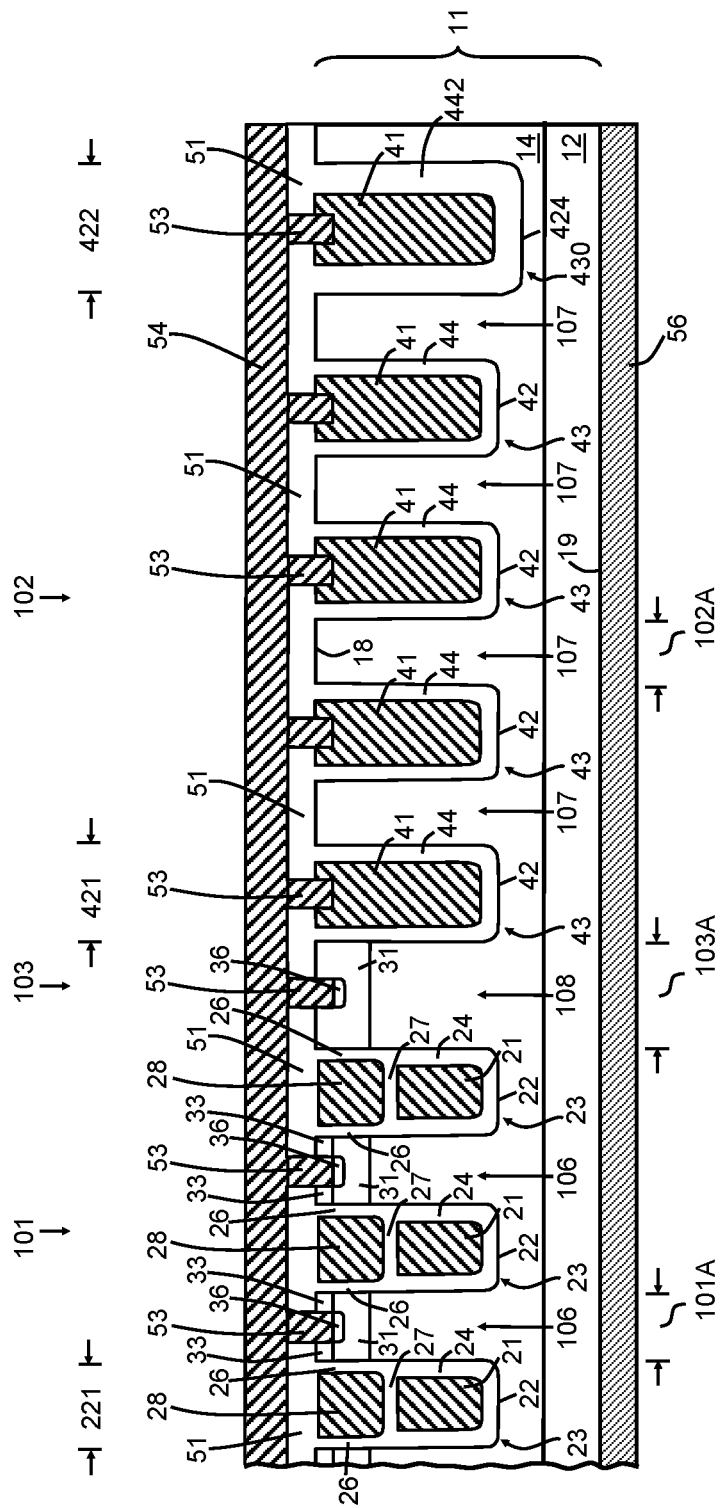

FIG. 12 illustrates a partial cross-sectional view of a semiconductor device 130 or device 130 in accordance with a still further example configured, among other things, to improve UIS performance. More particularly, transition region 103 is configured with increased carrier charge to improve the UIS capability of device 130. For example, width 103A of transition mesa region 108 is greater than width 101A of active mesa regions 106 and greater than width 102A of termination mesa regions 107. Device 130 is similar to device 10 and only the differences will be described hereinafter. In device 130, the outermost termination structure 430 comprises different characteristics than the other termination trench structures 43 as previously described. Outermost termination trench structure 430 comprises a termination trench 424 that has a width 422 that is greater or wider than width 421 of the other termination trenches 42. In some examples, termination trench 424 also extends further into semiconductor material 11 than the other termination trenches 42 as generally illustrated in FIG. 12. In some examples, outermost termination trench structure 430 comprises a dielectric structure 442 that is thicker than dielectric structures 44 of the other termination trench structures 43. In some examples, the thickness of dielectric structure 442 is about 25% to about 100% greater than the thickness of dielectric structures 44. In the present embodiment, outermost termination trench structure 430 can be referred to as a voltage blocking trench and its dielectric thickness is configured to reduce the electric field spread to the edge of device 130.

Figure 13:
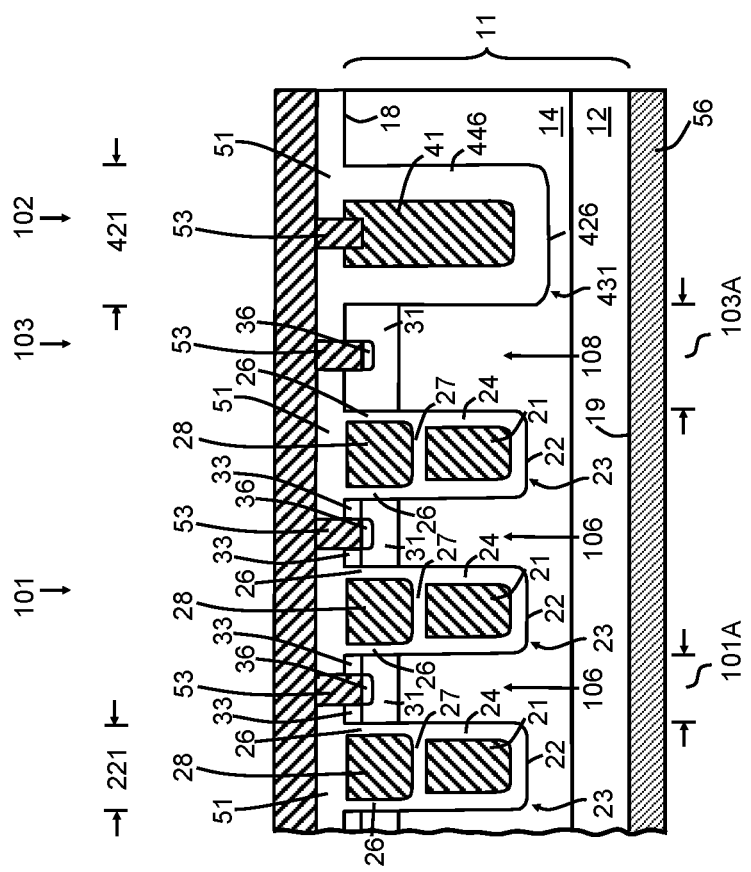

FIG. 13 illustrates a partial cross-sectional view of a semiconductor device 140 or device 140 in accordance with another example configured, among other things, to improve UIS performance. More particularly, transition region 103 is configured with increased carrier charge to improve the UIS capability of device 140. For example, width 103A of transition mesa region 108 is greater than width 101A of active mesa regions 106. Device 140 is similar to device 10 and device 130 and only the differences will be described hereinafter. Device 140 comprises a single termination trench structure 431 having a termination trench 426 extending from major surface 18 into semiconductor material 11. In some examples, termination trench 426 extends into semiconductor material 11 to a greater extent than active trenches 23. In addition, termination trench structure 431 comprises dielectric structure 446 that separates termination electrode 41 from semiconductor material 11. In the present example, dielectric structure 446 has a thickness that is greater than that of dielectric structures 24 in active trenches 23. In the present example, termination trench structure 431 can also be referred to a single voltage blocking trench. One advantage of the present example is that active area 101 can be larger or the overall die size can be reduced since termination trench structure 431 consumes less area.

Figure 14:
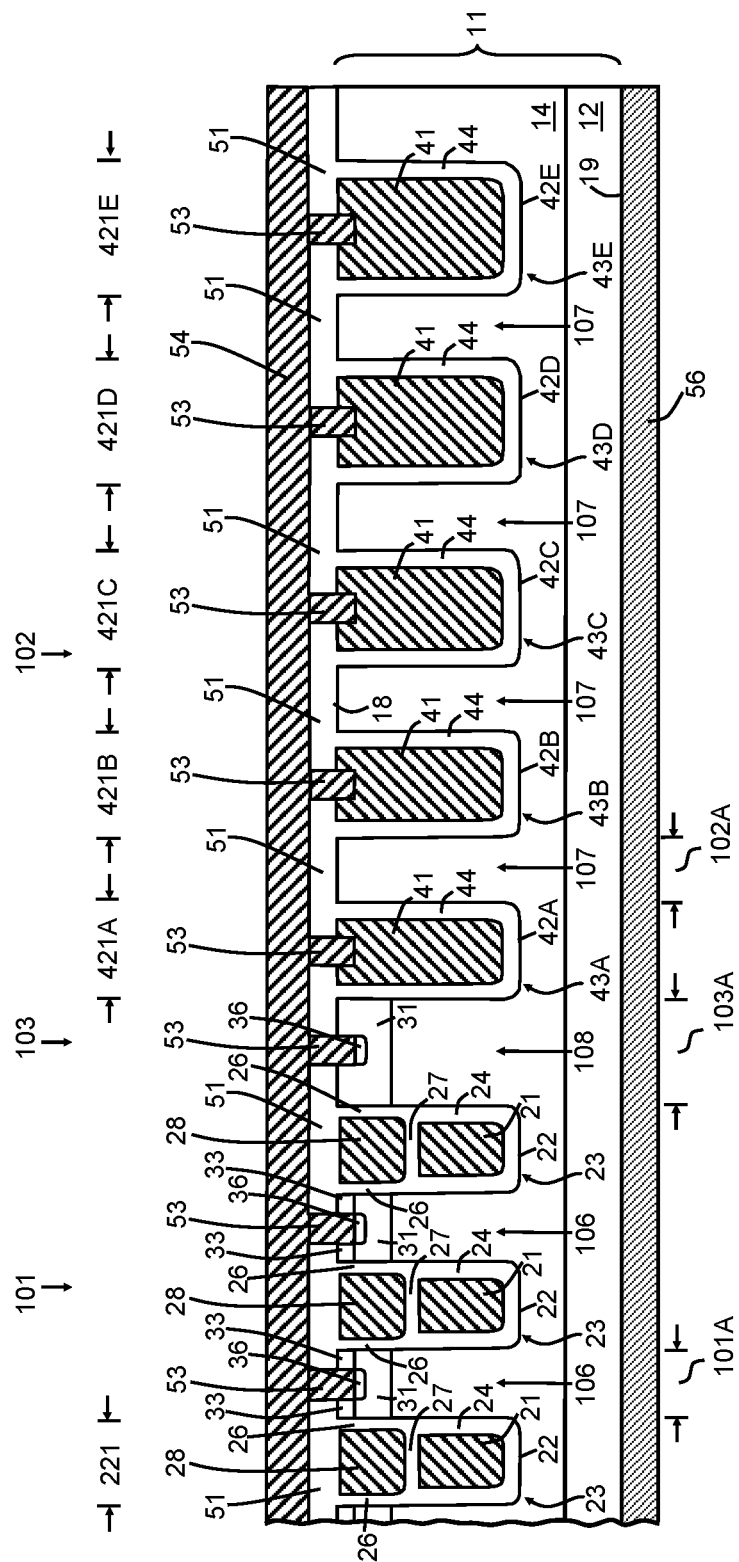

FIG. 14 illustrates a partial cross-sectional view of a semiconductor device 150 or device 150 in accordance with another example configured, among other things, to improve UIS performance. More particularly, transition region 103 is configured with increased carrier charge to improve the UIS capability of device 150. For example, width 103A of transition mesa region 108 is greater than width 101A of active mesa regions 106. In some examples, width 103A is also greater than width 102A of termination mesas 107. Device 150 is similar to device 10 and only the differences will be described hereinafter. Device 150 comprises a plurality of termination trench structures 43A, 43B, 43C, 43D, and 43E, each comprising termination trenches 42A, 42B, 42C, 42D, and 42E respectively. In the present example, the termination trenches 42A-42E each have a width 421A, 421B, 421C, 421D, and 421E respectively, which gradually increase in size from innermost termination trench 42A to outermost termination trench 42E. Of the termination trenches in termination region 102, termination trench 42E has the widest width 421E and termination trench 42A has the narrowest width 421A. In some examples, each termination trench 42A-42E is spaced a width 102A that is substantially equal. Stated a different way, each termination mesa 107 in termination region 102 has substantially the same width 102A.

In the present example, dielectric structures 44 in termination trenches 42A-42E can each have the substantially the same thickness. In other examples, the thicknesses of dielectric structures 44 can be different in some or each of the termination trenches 42A-42E. In some examples, termination trenches 42A-42E extend to a similar depth into semiconductor material 11. In other examples, the depths of some or all of termination trenches 42A-42E can be different. One advantage of the present example is that the electrical field can be spread more efficiently in termination region 102 to further ensure that breakdown occurs first in active region 101.

It is understood that the examples described herein or portions thereof can be combined to provide other devices in accordance with the present description. In some examples, multiple termination trench structures provide a benefit of pushing impact ionization more (for example, deeper) into the active trench structures so that UIS currents remain in the active region 101. In some examples, there is a benefit in having multiple termination trench structures compared to a single termination trench structure. For single termination trench structures, the outside sidewall dielectric can be under an increased stress and dielectric reliability can be poor. To counter this effect, a thicker dielectric can be used in the single termination trench structure examples.

Figure 15:
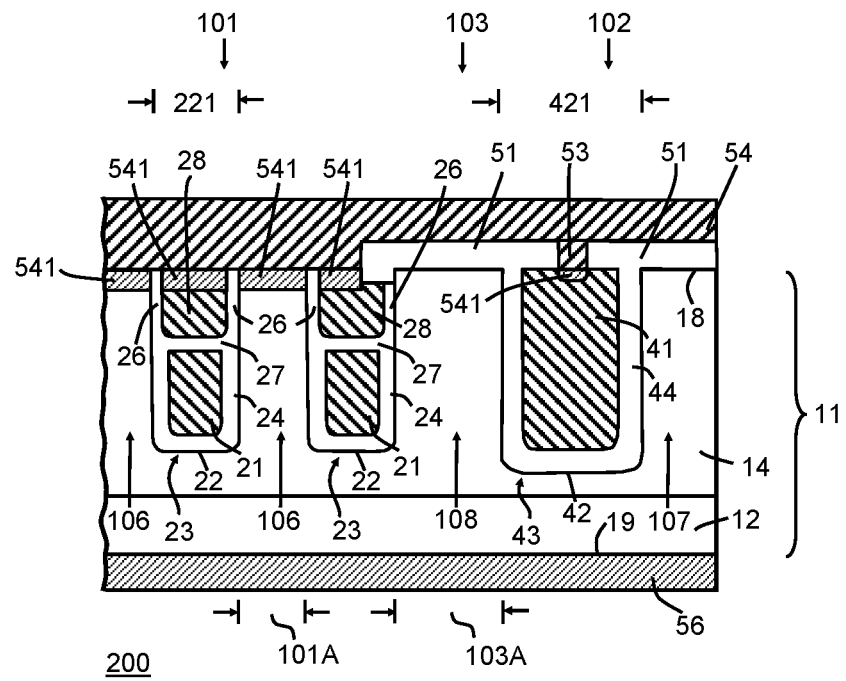

FIG. 15 illustrates a partial cross-sectional view of a semiconductor device 200 or device 200 in accordance with another example, configured, among other things, to improve UIS performance. More particularly, transition region 103 is configured with increased carrier charge to improve the UIS capability of device 200. For example, width 103A of transition mesa region 108 is greater than width 101A of active mesa regions 106. Device 200 is similar to device 10 and device 130 and only the differences will be described hereinafter. Device 200 is a Schottky rectifier device having Schottky contact regions 541 or contact regions 541. Active trench structures 23 are provided in a shielded gate configuration with gate electrodes 28 electrically connected to conductive layer 54 to provide, for example, a two terminal device. In most examples, termination trench structure 43 comprises a continuous trench 42 that completely surrounds active region 101.

Contact regions 541 comprise a material configured to provide a Schottky barrier structure with region of semiconductor material 11 or semiconductor layer 14. Such materials can include platinum, nickel-platinum (with various platinum atomic weight percentages, for example, from approximately 1% to approximately 80%, with 5% being selected in some examples), titanium, titanium-tungsten, chromium, and/or other materials capable of forming a Schottky barrier as known to those skilled in the art. Contact regions 541 can be formed using evaporation, sputtering, chemical vapor deposition, or other processes as known to those skilled in the art. The deposited material can then be exposed to one or more elevated temperatures to form a silicide with semiconductor material 11. The unreacted material can then be removed to provide contact regions 541 as generally illustrated in FIG. 15. When gate electrode 28 and termination electrode 41 comprise a polycrystalline semiconductor material, contact regions 541 can be formed with these structures as well as generally illustrated in FIG. 15.

As stated previously, in device 200 transition mesa region 108 has width 103A that is greater than widths 101A of active mesa regions 106. This increases carrier charge in transition mesa region 108 thereby influencing the breakdown of device 200 to occur in active region 101 as opposed to termination region 102. In accordance with the present example, this improves the UIS capability of device 200 compared to related devices where width 103A is the same as width 101A. In another example, doped region 58 can be included in transition mesa region 108, and in such an example, width 103A of transition mesa region 108 can be substantially equal to widths 101A.

Figure 16:
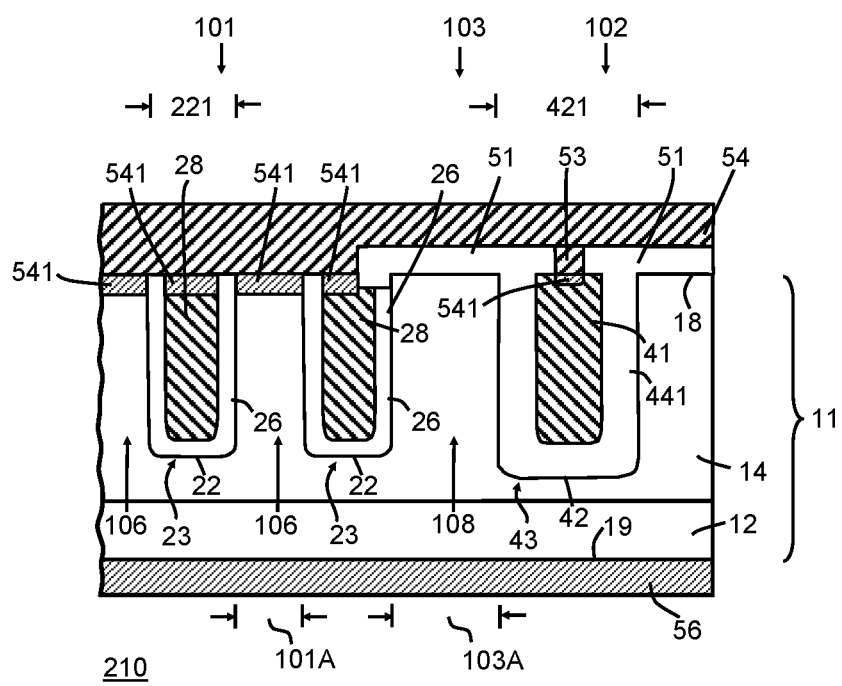

FIG. 16 illustrates a partial cross-sectional view of a semiconductor device 210 or device 210 in accordance with a further example, configured, among other things, to improve UIS performance. More particularly, transition region 103 is configured with increased carrier charge to improve the UIS capability of device 210. For example, width 103A of transition mesa region 108 is greater than width 101A of active mesa regions 106. Device 210 is similar to device 200 and only the differences will be described hereinafter. In device 210, termination trench 42 extends further into semiconductor material 11 than active trenches 22 to provide a single trench voltage blocking configuration. In addition, dielectric structure 441 within termination trench 42 is thicker than dielectric structures 26 in active trenches 22. In addition, active trench structures 23 are configured with a single gate electrode 28 instead of both a gate electrode 28 and a shield electrode 21. In the present example, gate electrode 28 and termination electrode 41 have a similar thickness, and can be formed at the same time. In another example, doped region 58 can be included in transition mesa region 108, and in this example, width 103A of transition mesa region 108 can be substantially equal to widths 101A. It is understood that termination trench structure 43 in device 210 can be used with device 200 in another example.

Figure 17:
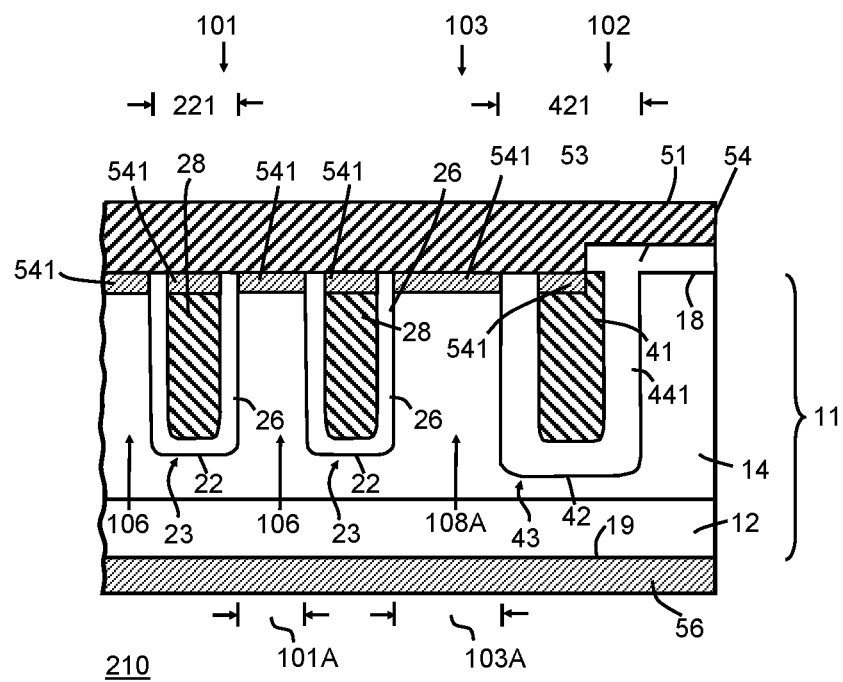

FIG. 17 illustrates a partial cross-sectional view of a semiconductor device 215 or device 215 in accordance with a still further example, configured, among other things, to improve UIS performance. More particularly, transition region 103 is configured with increased carrier charge to improve the UIS capability of device 215. For example, width 103A of transition mesa region 108A is greater than width 101A of active mesa regions 106. Device 215 is similar to device 210 and only the differences will be described hereinafter. In device 215, an additional Schottky contact region 541 is provided in electrical contact with transition mesa region 108A such that transition mesa region 108A is configured as a Schottky contact transition mesa region 108A. It is understood that Schottky contact transition mesa region 108A can be used with other examples described herein.

Figure 18:
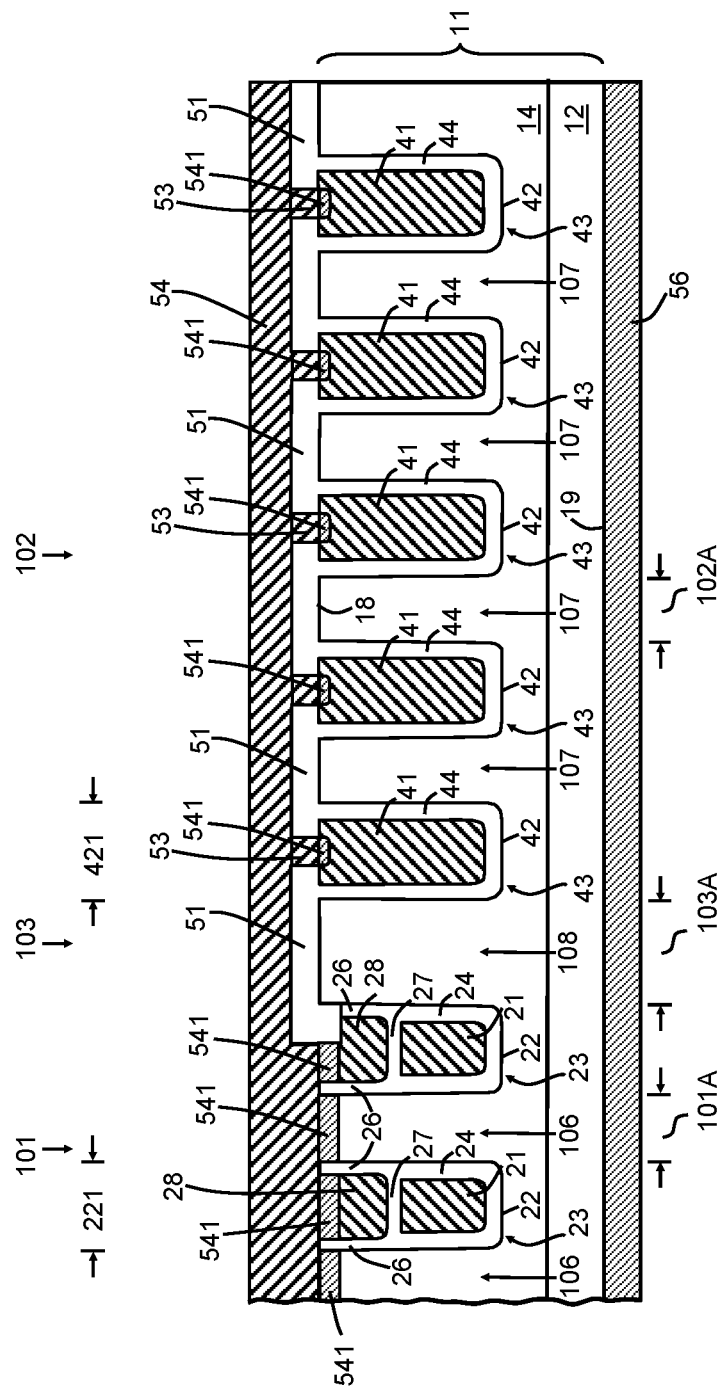

FIG. 18 illustrates a partial cross-sectional view of a semiconductor device 220 or device 220 in accordance with a further example, configured, among other things, to improve UIS performance. More particularly, transition region 103 is configured with increased carrier charge to improve the UIS capability of device 220. For example, width 103A of transition mesa region 108 is greater than width 101A of active mesa regions 106. In addition, width 103A is greater than widths 102A of termination mesa regions 107. Device 220 is similar to device 200 and only the differences will be described hereinafter. In device 220, a plurality of termination trench structures 43 are used in termination region 101. In the present example, dielectric structures 44 can be similar to dielectric structures 24 in active trench structures 23. In other examples, dielectric structures 44 can have a different thickness (for example, thicker) than dielectric structures 24. In the present example, termination trenches 42 have similar depths and depths similar to the depths of active trenches 23. In other example, these depths can be different. In another example, doped region 58 can be included in transition mesa region 108, and in this example, width 103A of transition mesa region 108 can be substantially equal to widths 101A. One advantage of the present example is that the electric field can be spread more efficiently in termination region 102 to further ensure that breakdown occurs first in active region 101.

Figure 19:
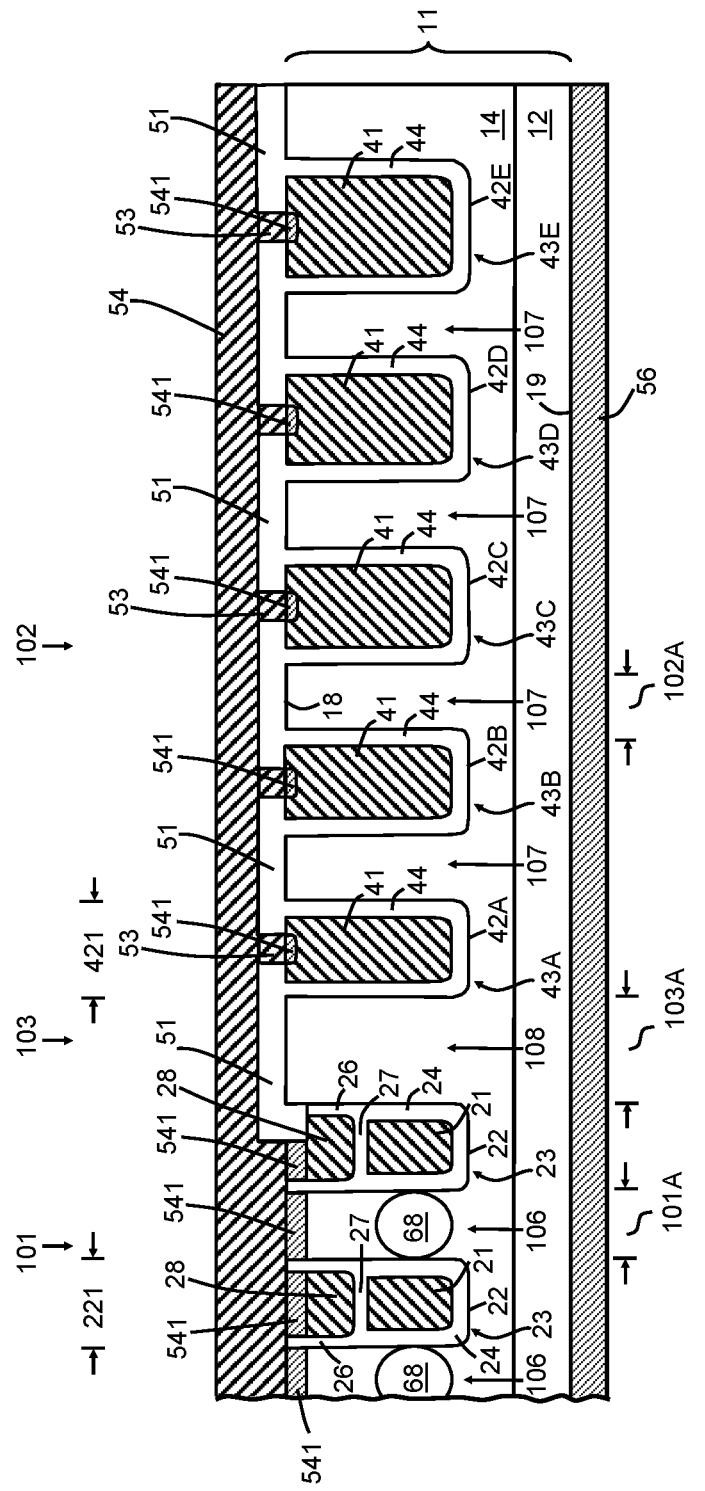

FIG. 19 illustrates a partial cross-sectional view of a semiconductor device 230 or device 230 in accordance with a further example, configured, among other things, to improve UIS performance. More particularly, transition region 103 is configured with increased carrier charge to improve the UIS capability of device 230. For example, width 103A of transition mesa region 108 is greater than width 101A of active mesa regions 106. In addition, width 103A is greater than widths 102A of termination mesa regions 107. Device 230 is similar to device 200 and device 220 and only the differences will be described hereinafter. Device 230 comprises a plurality of termination trench structures 43A, 43B, 43C, 43D, and 43E, each comprising termination trenches 42A, 42B, 42C, 42D, and 42E respectively. In the present example, the termination trenches 42A-42E each have a width 421A, 421B, 421C, 421D, and 421E respectively, which gradually increase in size from innermost termination trench 42A to outermost termination trench 42E. Of the termination trenches in termination region 101 in the present example, termination trench 42E has the widest width 421E and termination trench 42A has the narrowest width 421A. In some examples, each termination trench 42A-42E is spaced a width 102A that is substantially equal. Stated a different way, each termination mesa 107 in termination region 101 has substantially the same width 102A.

In the present example, dielectric structures 44 in termination trenches 42A-42E can have the substantially the same thickness. In other examples, the thicknesses of dielectric structures 44 can be different in some or each of the termination trenches 42A-42E. In some examples, termination trenches 42A-42E extend to a similar depth into semiconductor material 11. In other examples, the depths of some or all can be different. One advantage of the present example is that the electric field can be spread more efficiently in termination region 102 to further ensure that breakdown occurs first in active region 101.

In addition, device 230 comprises doped regions 68, which can be the same conductivity type (for example, N-type) as semiconductor layer 14 and can be configured to providing clamping action in reverse bias conditions to further improve dynamic robustness of device 230. In other examples, doped regions 68 can be configured to provide for conduction tuning of device 230. Doped regions 68 can be formed using one or more ion implantation doses and annealing techniques. Ion implantation energies and doses can be varied to provide desired results. In other examples, semiconductor layer 14 can comprise a graded dopant profile to provide similar results.

Figure 20:
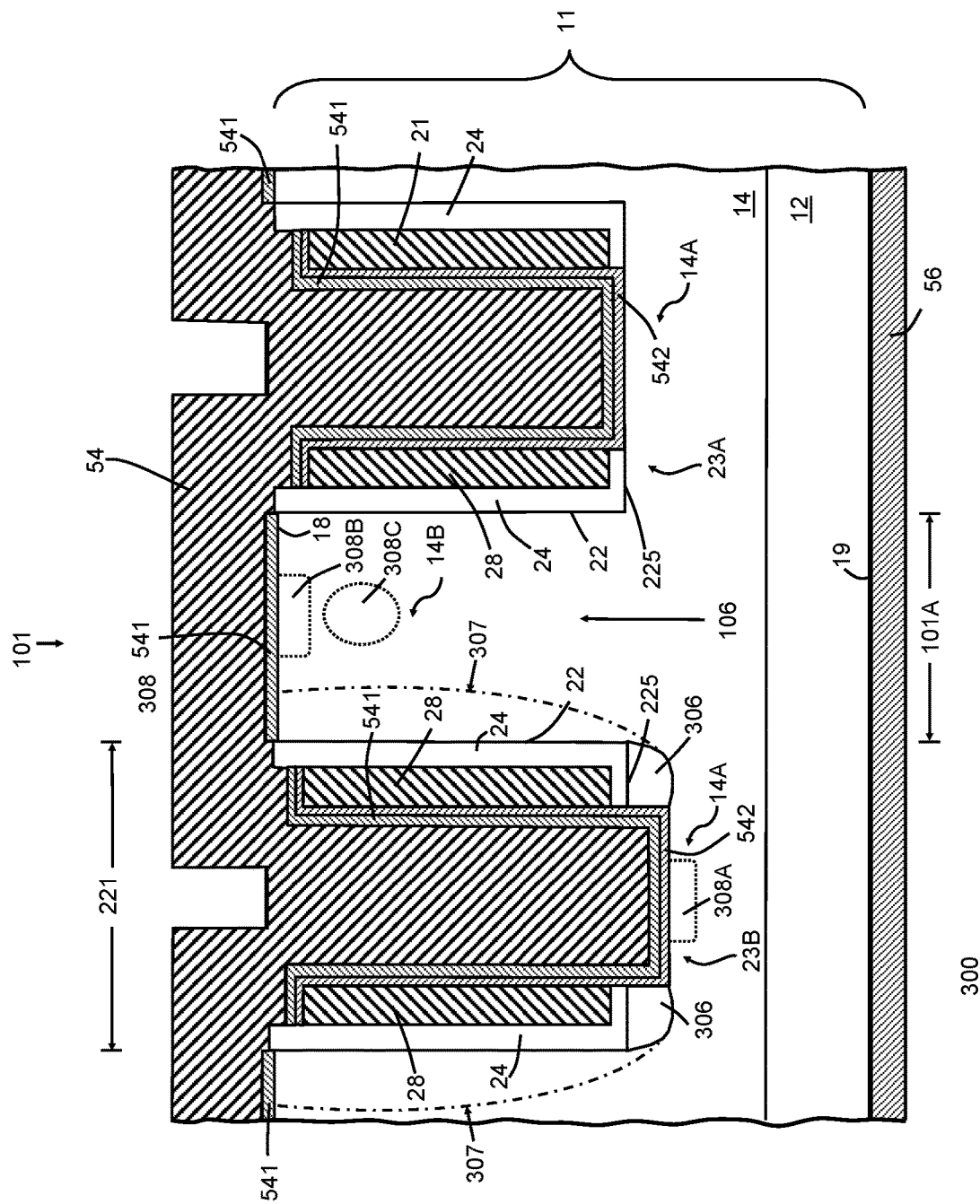

FIG. 20 illustrates a partial cross-sectional view of a semiconductor device 300 or device 300 in accordance with a further example. Device 300 in another example of a Schottky rectifier device that can be incorporated as part of active regions 101 including, but not limited to, the examples of FIGS. 15-19. Schottky rectifier designs involve a trade-off between forward voltage (Vf) and leakage current (Ir). In the past, lower barrier height metals, such as titanium, chromium, or nickel were used to achieve a lower Vf, but with a higher Ir. Higher barrier height metals, such as nickel-platinum alloys or platinum were used to lower Ir, but with a higher Vf. Trench MOS barrier Schottky (TMBS) devices as well as junction barrier Schottky (JBS) devices have been used to address this design tradeoff. However, both approaches have resulted in the consumption of active area by other structures typically used for the Schottky barrier regions. In accordance with the present description, device 300 is configured to compensate for the loss of active area by active trenches 23.

More particularly, device 300 uses the bottom surfaces 225 of trenches 22 as part of the active cell area for another Schottky contact region 542. Device 300 is illustrated with two different embodiments of the active trench structures, specifically active trench structure 23A and active trench structure 23B. It is understood that in some examples, all of the active trench structures can comprise active trench structure 23A. In other examples, all of the active trench structures can comprise structures similar to active trench structure 23B. In further examples, the active trench structures can comprise both active trenches structures 23A and 23B.

Active trench structure 23A can comprise dielectric structure 24 and gate electrodes 28 as described previously. In one example, dielectric structure 24 is first formed and then gate electrodes 28 can be formed using spacer formation processes. Gate electrodes 28 can be used as part of selective removal process to then remove a portion of dielectric structure 24 adjacent to bottom surface 225 of trench 22. Schottky contact region 542 can then be formed including where dielectric structure 24 was removed. In some examples, Schottky contact region 542 can comprise a higher barrier height metal or material, such as nickel, nickel-platinum, or platinum; and Schottky contact region 541 can comprise a lower barrier height metal or material, such as titanium or chromium. In some embodiments, the dopant concentration of a portion 14A of semiconductor layer 14 proximate to Schottky contact region 542 can be different than a portion 14B of semiconductor layer 14 proximate to Schottky contact region 541. In some examples, portion 14B can comprise a higher dopant concentration than portion 14A. Portions 14A and 14B can be formed using ion implantation and anneal processes, epitaxial growth processes during the formation of semiconductor layer 14, combinations thereof, or by other processes as known to those skilled in the art. Schottky contact region 541 can then be formed as described previously. Schottky contact regions 541 and 542 can be annealed together in some examples, or can be annealed in separate steps and then the unreacted material removed as described previously.

Active trench structure 23B is similar to active trench structure 23A and only the differences will be described hereinafter. Active trench structure 23B comprises guard ring structure 306 disposed adjacent to bottom surface 225. In some examples, guard ring structure 306 comprises a P-type conductivity type and can be formed using ion implantation and anneal processes or other processes known to those skilled in the art. In some examples, guard ring structure 306 has a peak dopant concentration of about $5.0 \times 10^{16}$ atoms/cm$^3$. Next, a semiconductor etch can be used to extend through a portion of guard ring structure 306 where Schottky contact region 542 is to be formed. In this way, Schottky contact region 542 extends into semiconductor layer 14 below bottom surface 225 of trench 22 in a recessed configuration such that size surfaces of guard ring structure 306 adjoin portions of side surfaces of Schottky contact region 542 as generally illustrated in FIG. 20. Guard ring structure 306 is configured to enhance the breakdown voltage of device 300. In addition, as width 101A is decreased, adjoining guard ring structure 306 can form a JBS structure that pinches-off the leakage current thereby reducing the leakage current for Schottky contract 542, compared to related devices. In other examples, guard ring structure 306 can extend adjacent to side surfaces of trench 22 up towards major surface 18 as denoted by element 307 (shown as a dashed line to illustrate an alternative example) in FIG. 20 to provide a different pinch-off JBS configuration for Schottky contact 542.

In other examples, a doped region 308A can be disposed within semiconductor layer 14 adjacent to Schottky contact 542 and can be doped similar to guard ring structure 306 described previously. In further examples a doped region 308B can be disposed within semiconductor layer 15 adjacent to Schottky contact region 541 and can be doped similar to guard ring structure 306. In still further examples, a doped region 308C can be provided within active mesa region 106 proximate to but spaced apart from Schottky contact region 541 and can be doped similar to guard ring structure 306. Doped regions 308A, 308B, and 308C are illustrated in dashed outline to simply indicate that one, more than one, or all these regions can be optional in some examples. Doped regions 308A, 308B, and 308C are configured to provide different pinch-off JBS configurations for Schottky contract regions 542 and 541.

In both active trench structure 23A and active trench structure 23B, Schottky contact regions 542 (and in some examples, Schottky contact regions 541) are formed adjacent to side surfaces of gate electrodes 28 to provide continuous coverage with conductive layer 54. In other examples, gate electrodes 28 are not used and conductive layer 54 can be formed adjacent to dielectric structures 24. In some examples, Schottky regions 541 and 542 can comprise the same materials and the dopant concentration in portion 14A is reduced compared to portion 14B. Both active trench structure 23A and active trench structure 23B were found through experimentation to reduce Vf and Ir compared to related devices.

Figure 21:
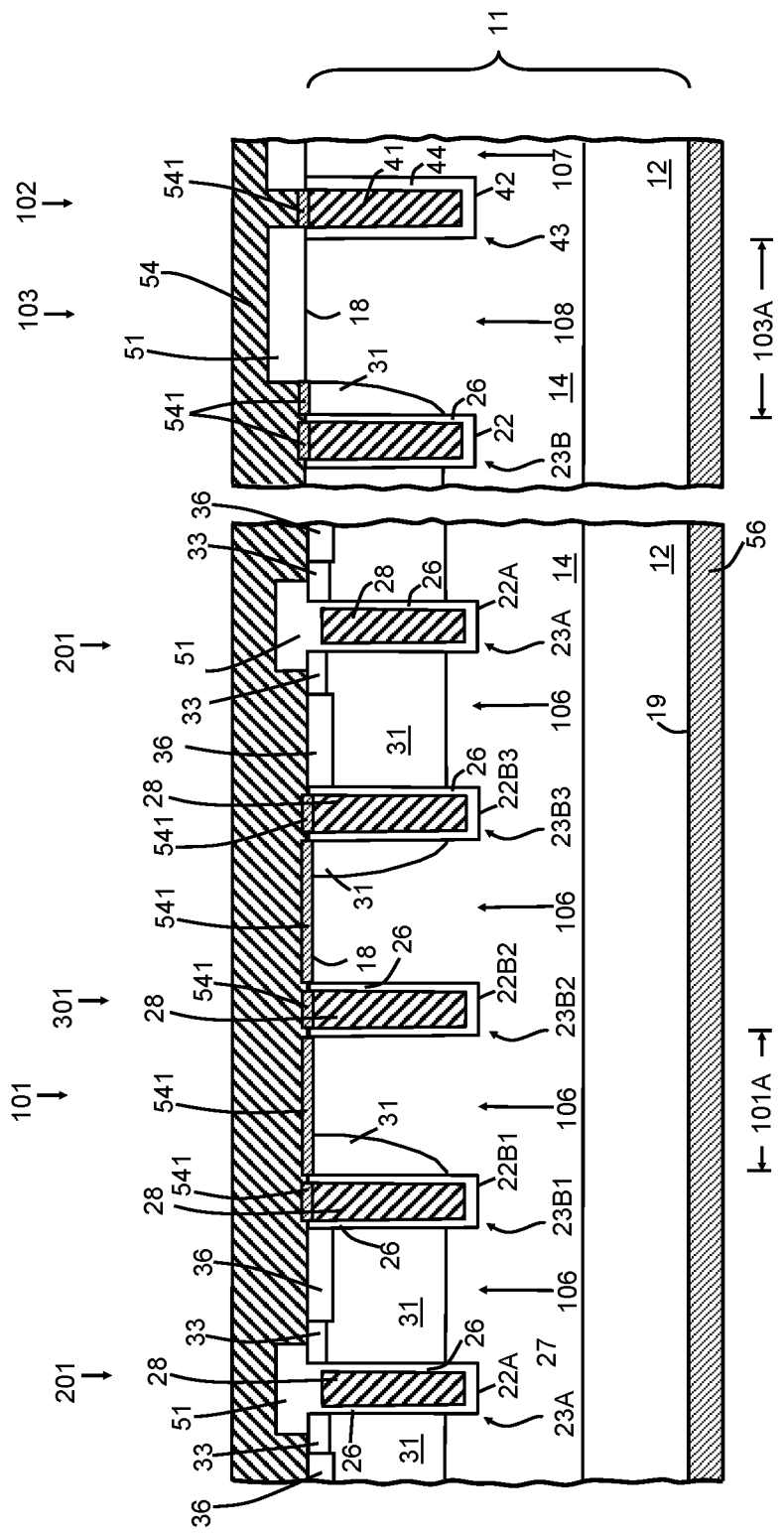

FIG. 21 illustrates a partial cross-sectional view of a semiconductor device 400 or device 400 in accordance with a further example, configured, among other things, to improve UIS performance. More particularly, transition region 103 is configured with increased carrier charge to improve the UIS capability of device 400. For example, width 103A of transition mesa region 108 is greater than width 101A of active mesa regions 106. Although only one termination trench structure 43 is illustrated in FIG. 21 in termination region 102, additional termination trench structures 43 can be used with widths 102A as described previously. In such examples, width 103A can be greater than widths 102A. Similar to device 10, device 400 is a MOSFET device having active trench structures 23A configured as trench gate MOSFET structures 201 and active trench structures 23B configured as s Schottky rectifier device 301 integrated in a single device. Device 400 is similar to device 10 and device 210 and only the differences will be described hereinafter.

Device 400 is configured without shielding electrodes in active trenches 22A and 22B1, 22B2, and 22B3. In other examples, it is understood that shield electrodes, such as shield electrodes 21 as described previously can be included with device 400. Within active region 101, active trench structures 23B1, 23B2, and 23B3 are used in conjunction with Schottky rectifier device 301 and, in the present example, comprises three active trenches 22B1, 22B2, and 22B3, separated by active mesa regions 106 having widths 101A. Active trench structures 23A are used in conjunction with trench gate MOSFET structures 201.

Active trench structures 23A and 23B1-22B3 comprise gate electrodes 28 separated from semiconductor material 14 by, for example, dielectric structures 26. Active trenches 22B1 and 22B3 are bounded on at least two sides by base region 31 in cross-sectional view. Active trench 22B2 is not bounded on any sides by base region 31 in the cross-sectional view, and instead is bounded by semiconductor layer 14. In this configuration, pinch-off occurs in Schottky rectifier device 301 with depletion of base regions 31 adjacent to active trench structures 23B1 and 23B3, and from depletion from the trench MOS effect of active trench structure 22B2. That is, Schottky rectifier device 301 is combination of a junction barrier Schottky (JBS) and a trench MOS barrier Schottky (TMBS) configuration where active trench structures 23B1 and 23B3 together with base regions 31 provide the JBS portion, and active trench structure 23B2 configured without an adjacent base region 31 provides the TMBS portion. This is different from related devices that are either a JBS configuration or a TMBS configuration, whereas in the present description both the JBS configuration and the TMBS configuration are combined together in a single device. One advantage of the present example is that the electrical field can be spread more efficiently in termination region 102 to further ensure that breakdown occurs first in active region 101.

From all of the foregoing, one skilled in the art can determine that according an example, a semiconductor device can comprise multiple termination trench structure provides as continuous ring-like structures in a termination region that surround active trench structures. In another example, a first termination trench ring is wider spaced from an adjacent active trench, compared to spacing between other active trenches. In a further example, the semiconductor device can comprise a shielded-gate trench MOSFET device and/or a Schottky device with multiple termination trenches having insulated termination electrodes where the termination trenches are disposed so as to surround the active trenches, and where an innermost termination trench is spaced from an outermost active trench a spacing that is wider than the spacing between any adjoining active trenches in the active region.

From all of the foregoing, one skilled in the art can determine that according to a still further example, a semiconductor device can comprise a thinner dielectric structure in the active trenches compared to one or more of the dielectric structures in the termination trenches. In some examples, all of the termination trench structures can have thicker dielectric structures. This enables heavier doping concentration in the active mesa regions, which provides lower on-resistance in IGFET devices and lower Vf in Schottky devices. In another example, the outermost or last termination trench structure can be the widest trench structure, can be the deepest trench structure, and can have the thickest dielectric structure compared to the other trench structures.

From all of the foregoing, one skilled in the art can determine that according to a further example, a semiconductor device can comprise termination trench structures having widths that vary from narrower to wider going an innermost termination trench structure to an outermost trench structure where the outermost termination trench structure is the widest, which can provide a more uniform electric field distribution. In one example, the dopant concentration or dopant carrier charge between the innermost termination trench structure and the outermost active structure is greater than the dopant concentration or dopant carrier charge between two adjacent active trench structures. In a further example, the semiconductor device can comprise a non-uniformly doped drift charge between an outermost active trench structure and an innermost and termination trench structure. In another example, the transition region has more drift charge or charge volume than the active region, were the drift charge is changed by a dimension change (for example, width) or by a dopant concentration change.

From all of the foregoing, one skilled in the art can determine that according to a still further example, a semiconductor device structure can further comprise an outermost termination trench structure disposed proximate to an edge of the electronic device structure. In another example, the first termination trench structure comprises a first termination electrode separated from the region of semiconductor material by a first termination dielectric layer having a first thickness, and the outermost termination trench structure comprises a second termination electrode separated from the region of semiconductor material by a second termination dielectric layer having a second thickness. In a further example, the second thickness is greater than the first thickness. In a still further example, the outermost termination trench structure is shallower than the first termination trench structure. In another example, the first termination trench structure is a continuous structure that completely surrounds, encompasses, and encloses the active region without any breaks.

From all of the foregoing, one skilled in the art can determine that according to another example, the semiconductor device can further comprise a plurality of termination trench structures disposed in the region of semiconductor material between an edge region of the electronic device structure and first termination trench structure and separated by a plurality of termination mesa regions. In a further example, each termination mesa region has a third width less than the second width. In a still further example, at least some termination mesa regions have different width. In another example, the plurality of termination trench structures each comprise a continuous structure that completely surrounds, encompasses, and encloses the active region without any breaks.

From all of the foregoing, one skilled in the art can determine that according to a further example, a method of forming an electronic device structure can comprise providing a region of semiconductor material have an active region and a termination region. The method can comprise providing a first active trench structure disposed in the active region and providing a second active trench structure disposed in the active region and laterally separated from the first active trench by an active mesa having a first width. The method can comprise providing a first termination trench structure disposed in the termination region and separated from the second active trench by a transition mesa having a second width greater than the first width. In a still further example, the method can further comprise providing a second termination trench disposed in the termination region and separated from the first termination trench by a first termination mesa region having a third width less than the second width. In another example, the method can further comprise providing a first PHV region disposed in the first termination mesa, wherein the first PHV region is an electrically floating region. In a further example, the method can further comprise providing a first disposed region disposed in the transition mesa region and spaced apart from a first major surface of the region of semiconductor material.

From all of the foregoing, one skilled in the art can determine that according to a still further example providing the second active trench structure can comprise providing an insulated active shield electrode and an insulated active gate electrode. In another example, providing the first termination trench structure can comprise providing a termination electrode separated from the region of semiconductor material by a termination dielectric layer having a first thickness. In a further example, providing the insulated active shield electrode can comprise providing an active shield electrode separated from the region of semiconductor material by an active shield dielectric layer having a second thickness. In a still further example, the second thickness is less than the first thickness. In another example, the method further comprises providing an outermost termination trench structure disposed proximate to an edge of the electronic device structure. In a further example, providing the first termination trench structure comprises providing a first termination electrode separated from the region of semiconductor material by a first termination dielectric layer having a first thickness, and providing the outermost termination trench structure comprises providing a second termination electrode separated from the region of semiconductor material by a second termination dielectric layer having a second thickness. In a still further example, the second thickness is greater than the first thickness.

In another example, the outermost termination trench structure is shallower than the first termination trench structure. In a further example, wherein the first termination trench structure is a continuous structure that completely surrounds, encompasses, and encloses the active region without any breaks. In a still further example, the method can further comprise providing a plurality of termination trench structures disposed in the region of semiconductor material between an edge region of the electronic device structure and the first termination trench structure and separated by a plurality of termination mesa regions. In another example, has least one of the termination mesa regions has a width less than the second width. In a further example, at least some termination mesa regions have different widths.

In view of all of the above, it is evident that a novel structure and method of making the structure are disclosed. Included, among other features, is a structure including active trench structures disposed in an active region and separated by active mesa regions; termination trench structure(s) disposed in a termination region, and a transition mesa region interposed between the active region and the termination region. The structure is configured to have a charge imbalance where the transition mesa region comprises a higher carrier charge than any one of the active mesa regions. In this way, breakdown voltage is shifted to occur in the action region before it occurs in the transition mesa region or the termination region. By shifting the breakdown voltage to the active region, unclamped inductive switching performance (UIS) is improved. In some examples, the structure comprises an insulated gate device, such as a MOSFET device, a Schottky rectifier device, or similar devices. In addition to showing improved UIS performance, the structure and method described herein show higher and more stable avalanche peak current ($I_{pk}$,) tighter $I_{pk}$ distribution across a semiconductor wafer thereby leading to reduced UIS yield loss. The structure and method can be implemented into existing process flows, which saves on manufacturing costs and cycle time.

While the subject matter of the invention is described with specific preferred embodiments and example embodiments, the foregoing drawings and descriptions thereof depict only typical examples of the subject matter, and are not therefore to be considered limiting of its scope. It is evident that many alternatives and variations will be apparent to those skilled in the art.

As the claims hereinafter reflect, inventive aspects may lie in less than all features of a single foregoing disclosed example. Thus, the hereinafter expressed claims are hereby expressly incorporated into this Detailed Description of the Drawings, with each claim standing on its own as a separate example of the invention. Furthermore, while some examples described herein include some but not other features included in other examples, combinations of features of different examples are meant to be within the scope of the invention and meant to form different examples as would be understood by those skilled in the art.

What is claimed is:

1. A semiconductor device structure comprising: a region of semiconductor material comprising a first conductivity type, an active region, and a termination region; a first active trench structure disposed in the active region; a second active trench structure disposed in the active region and laterally separated from the first active trench by an active mesa region having a first width, the active mesa region having a first doping concentration of the first conductivity type; a first termination trench structure disposed in the termination region and laterally separated from the second active trench by a transition mesa region having a second width and a second doping concentration of the first conductivity type; and a second termination trench disposed in the termination region and laterally separated from the first termination trench by a first termination mesa region having a third width and a third doping concentration of the first conductivity type, wherein: the second doping concentration is greater than the first doping concentration and the second width is greater than the first width.

2. The structure of claim 1, further comprising:
a first base region comprising a second conductivity type opposite to the first conductive type disposed in the active mesa region;
a second base region comprising the second conductivity type in the transition mesa region; and
a third base region comprising the second conductivity type in the first termination mesa region.

3. The structure of claim 1, further comprising:
a first doped region of the first conductivity type and having the second doping concentration disposed in the transition mesa region, wherein:
the first doped region is spaced apart from a first major surface of the region of semiconductor material and is laterally interposed between the first termination trench and the second active trench.

4. The structure of claim 1, further comprising:
a base region of a second conductivity type opposite to the first conductivity type disposed in the active mesa region adjacent the first active trench; and
a source region of the first conductivity type disposed in the base region.

5. The structure of claim 1, wherein:
the first active trench structure comprises:
a shield electrode separated from the region of semiconductor material by a first dielectric structure; and
a gate electrode separated from the region of semiconductor material by a second dielectric structure;
the first termination trench structure comprises:
a termination electrode separated from the region of semiconductor material by a third dielectric structure; and
the semiconductor device structure further comprises a conductive layer electrically connected to the shield electrode and the termination electrode.

6. The structure of claim 1, wherein:
the first-termination trench structure comprises a continuous structure that completely surrounds the active region in a plan view.

7. The structure of claim 2, wherein:
the third base region is electrically floating.

8. The structure of claim 7, wherein:
the first base region and the second base region are electrically connected.

9. The structure of claim 2, further comprising:
a source region within the first base region, wherein:
the second base region and the third base region are devoid of source regions.

10. The structure of claim 1, wherein:
the second doping concentration is greater than the third doping concentration.

11. The structure of claim 1, wherein:
the first doping concentration has a first peak doping concentration;
the second doping concentration has a second peak doping concentration; and
the second peak doping concentration is greater than the first peak doping concentration in range from about five percent (5%) to about fifty percent (50%).

12. A semiconductor device structure, comprising: a region of semiconductor material comprising a first conductivity type, a first major surface, a second major surface opposite to the first major, an active region, a termination region, and a transition region interposed between the active region and the termination region; active trench structures extending from the first major surface into the region of semiconductor material within the active region, wherein the active trench structures are laterally separated from each other by active mesa regions, wherein the active mesa regions have a first doping concentration of the first conductivity type; a termination trench structure extending from the first major surface into the region of semiconductor material within the termination region; a transition mesa region interposed between an outermost one of the active trench structures and the termination trench structure, wherein the transition mesa region comprises a second doping concentration of the first conductivity type that is greater than the first doping concentration; base regions comprising a second conductivity type opposite to the first conductive type disposed in at least some of the active mesa regions and the transition mesa region adjacent to the first major surface; and source regions comprising the first conductivity type disposed in the base regions in the active mesa regions but not in the transition mesa region.

13. The structure of claim 12, wherein:
the active trench structures each comprise:
an active trench; and
a first electrode disposed within the active trench and separated from the region of semiconductor material by a first dielectric structure having a first thickness;

the termination trench structure comprises:
  a termination trench; and
  a second electrode disposed within the termination trench and separated from the region of semiconductor material by a second dielectric structure having a second thickness;
the active mesa regions each comprises a first width in a cross-sectional view; and
the transition mesa region comprises a second width in the cross-sectional view.

14. The structure of claim 13, wherein:
the termination trench structure is an innermost one of a plurality of termination trench structures disposed in the termination region; and
the plurality of termination trench structures are separated from each other by termination mesa regions.

15. The structure of claim 12, wherein:
the first doping concentration has a first peak doping concentration;
the second doping concentration has a second peak doping concentration; and
the second peak doping concentration is greater than the first peak doping concentration in range from about five percent (5%) to about fifty percent (50%).

16. The structure of claim 12, further comprising:
a second termination trench structure disposed in the termination region and laterally separated from the termination trench structure by a first termination mesa region having a third width and a third doping concentration of the first conductivity type;
a first base region comprising a second conductivity type opposite to the first conductive type disposed in the active mesa regions;
a second base region comprising the second conductivity type in the transition mesa region; and
a third base region comprising the second conductivity type in the first termination mesa region, wherein:
  the third base region is electrically floating; and
  the first base region and the second base region are electrically connected.

17. A semiconductor device structure comprising: a region of semiconductor material comprising a first conductivity type, an active region, and a termination region; a first active trench structure in the active region; a second active trench structure in the active region and laterally separated from the first active trench by an active mesa region having a first width, the active mesa region having a first doping concentration of the first conductivity type; a first termination trench structure in the termination region and laterally separated from the second active trench by a transition mesa region having a second width and a second doping concentration of the first conductivity type; a second termination trench in the termination region and laterally separated from the first termination trench by a first termination mesa region having a third width and a third doping concentration of the first conductivity type; a first base region comprising a second conductivity type opposite to the first conductive type in active mesa region; a second base region comprising the second conductivity type in the transition mesa region; and a third base region comprising the second conductivity type in the first termination mesa region, wherein: the second doping concentration is greater than the first doping concentration, wherein: the third base region is electrically floating; and the first base region and the second base region are electrically connected.

* * * * *